United States Patent [19]
Taguchi et al.

[11] Patent Number: 5,468,694
[45] Date of Patent: Nov. 21, 1995

[54] COMPOSITION FOR PRODUCING LOW TEMPERATURE CO-FIRED SUBSTRATE

[75] Inventors: Tomoyuki Taguchi; Hideyuki Kuribayashi, both of Hyogo; Jun Tanaka, Kagoshima; Tomomi Konaga, Kagoshima; Yoshihiro Morigami, Kagoshima, all of Japan

[73] Assignees: Yamamura Glass Co. Ltd., Nishinomiya; Kyocera Corporation, Kyoto, both of Japan

[21] Appl. No.: 156,059

[22] Filed: Nov. 22, 1993

[30] Foreign Application Priority Data

| | | | |
|---|---|---|---|
| Nov. 21, 1992 | [JP] | Japan | 4-335554 |
| Aug. 4, 1993 | [JP] | Japan | 5-213401 |
| Aug. 26, 1993 | [JP] | Japan | 5-235437 |

[51] Int. Cl.⁶ .................................................. C03C 3/064
[52] U.S. Cl. .................................. 501/77; 501/17; 501/32; 501/5
[58] Field of Search .............................. 501/5, 17, 32, 501/77

[56] References Cited

U.S. PATENT DOCUMENTS

| | | | |
|---|---|---|---|
| 4,396,720 | 8/1983 | Beall et al. | |
| 4,519,828 | 5/1985 | Beall et al. | |
| 4,526,873 | 7/1985 | Beall et al. | |
| 4,528,275 | 7/1985 | Hodge | |
| 4,654,095 | 3/1987 | Steinberg | 501/17 X |
| 4,655,864 | 4/1987 | Rellick | 501/17 X |
| 4,849,379 | 7/1989 | McCormick | 501/32 X |
| 4,849,380 | 7/1989 | Sawhill | 501/32 X |
| 5,356,841 | 10/1994 | Mizutani et al. | 501/32 |

FOREIGN PATENT DOCUMENTS

| | | |
|---|---|---|
| 59-39744 | 3/1984 | Japan . |
| 59-83957 | 5/1984 | Japan . |
| 61-10056 | 1/1986 | Japan . |
| 61-31348 | 2/1986 | Japan . |
| 61-149336 | 9/1986 | Japan . |
| 2047196 | 2/1987 | Japan ................. C03C 4/16 |
| 4254468 | 9/1992 | Japan . |
| 5238774 | 9/1993 | Japan . |

*Primary Examiner*—Karl Group
*Attorney, Agent, or Firm*—Vineet Kohli; Thomas R. Morrison

[57] ABSTRACT

A novel crystallizable glass composition for producing a novel low temperature co-fired glass-ceramic substrate having patterns of a low electrical-resistance conductor such as Ag, Ag-Pd, Au, and/or Cu is obtained. Being subjected to a firing process, the novel crystallizable glass can precipitate mullite as main crystalline phase, and at least one subordinate crystalline phase among forsterite, spinel, sapphirine, and similar crystalline phases. And also, the novel crystallizable glass powder composition with a inorganic filler as external additive having a minimum of 1.4 m²/g. of mean specific surface area can precipitate both mullite phase and cordierite phase. The mixing weight ratio of the filler to the crystallizable glass powder is from 0.1/99.9 to 20/80. The crystallizable glass composition comprises following oxide components expressed in terms of percent by weight on the oxide basis; 45–58% of $Al_2O_3$, 20–35% of $SiO_2$, 5–15% of $B_2O_3$, 5–20% of MgO, and 0–4% of alkali metal oxide. The substrates produced from the above compositions have high flexural strength, low dielectric constant, low loss factor, and controllable thermal expansion coefficient of ranging from about 30 to about $70\times10^{-7}/°C$. As for the substrate containing both mullite phase and cordierite phase, as the substrate has a low thermal expansion coefficient, it can be combined with AlN to produce a composite structure package.

20 Claims, 1 Drawing Sheet

COMPOSITION FOR PRODUCING LOW TEMPERATURE CO-FIRED SUBSTRATE

BACKGROUND OF THE INVENTION

The present invention relates to a composition for producing a co-fired glass-ceramic substrate having patterns of a low electrical-resistance conductor such as Ag, Ag-Pd, Au and/or Cu, for example.

The said substrate mounts a variety of chip components including semiconductor devices, coils, capacitors, resistors, and others, and said chip components mutually are connected by the conductor.

Substrates containing both mullite crystalline phase and cordierite crystalline phase are preferably used for electronic packages incorporating parts composed of aluminum nitride (AlN) for mounting semiconductor devices.

Conventionally, alumina ($Al_2O_3$) is used for composing substrates built in computers and consumer-use electrical appliances. To sinter alumina, extremely high temperature approximating to 1600° C. is required, and therefore, specific metallic material such as tungsten (W) or molybdenum (Mo) having high melting point is used for the patterning conductor which is subject to a firing process in conjunction with alumina. However, either of the above-cited metallic materials has a high electrical-resistance value, and therefore, Ag, Ag-Pd, Au, and Cu having a low resistance have long been desired as conductors. In response, a wide variety of arts have been proposed for providing substrates sinterable under low temperature at a temperature ranging from about 850° C. to about 1050° C. and capable of accommodating the above-cited low-resistance conductors thereon.

The Japanese Patent Laid-Open No. SHO61-31348 (1986) discloses an art "Ceramics sintered under low temperature", which proposes such a substrate complete with a process to mix 55%–60% of $CaO-B_2O_3-SiO_2$ glass with 40%–45% of filler material such as alumina followed by a process to sinter the mixture at a low temperature ranging from 750° C. to 850° C. The Japanese Patent Laid-Open No. SHO59-83957 (1984) discloses an art "Crystallizable glass material", which proposes such a substrate complete with a process to yield frit by way of pulverizing crystallizable glass composition comprising 40%–52% by weight of $SiO_2$, 27%–37% by weight of $Al_2O_3$, 10%–20% by weight of MgO, 2%–8% by weight of $B_2O_3$, 2%–8% by weight of CaO, and 0.1%–3% by weight of $ZrO_2$, followed by a process to form frit, and a final process to sinter the formed frit under a low temperature ranging from 900° C. to 950° C. However, because of weak strength of glass matrix, the substrate proposed by the former art has weak strength merely being rated to be 15 through 19 $kgf/mm^2$. Likewise, because of weak strength of cordierite sharing main crystalline phase, the substrate proposed by the latter art also has weak strength merely being rated to be 17–21 $kgf/mm^2$. As is apparent from these prior art, because of insufficient strength, each of those preceding arts still has technical problem by way of easily incurring crack to multilayer substrates produced from poor-strength glass ceramics, thus requiring care whenever handling them.

In addition, because of low thermal conductivity, each of those conventional substrates fired under low temperature could not mount a high-speed LSI thereon in that it consumes a large amount of electric power. To solve this problem, as was disclosed in the Japanese Utility Model Laid-Open No. SHO61-149336 (1986) for example, a package incorporating composite structure was proposed. The proposed package comprises a part for mounting high-speed LSI devices thereon and the said part uses specific material having high thermal conductivity such as aluminum nitride (AlN) for example. The said package further comprises a patterned multilayer substrate fired under low temperature. It is essential for the package containing composite structure to exhibit approximate values of thermal expansion coefficient between the part having high thermal conductivity and the part of substrate fired under low temperature. It is also essential for the substrate itself to have high strength. However, according to the package based on the composite structure cited above, actual values of thermal expansion coefficient between the part having high thermal conductivity and the substrate fired under low temperature are different from each other. This in turn easily generates residual stress. And also the part of substrate has quite insufficient strength.

In terms of rough classification, conventionally known substrates subject to a firing process under low temperature are made from each of glass composition with filler, ceramic composition, and crystallizable glass composition. Of these, the glass composition with filler easily achieves the objective thermal expansion coefficient. However, the glass composition with filler has quite weak strength as mentioned above. Conversely, although the ceramic composition and the crystallizable glass composition respectively have substantial strength, neither of these can easily achieve the objective thermal expansion coefficient.

On the other hand, under the title of "Method of manufacturing porcelain based on mullite composition", the Japanese Patent Laid-Open No. HEI4-254468 (1992) discloses a method of manufacturing a substrate fired under low temperature by executing a step to prepare mixture powder comprising 15–60% by weight of mullite powder and 40–85% by weight of glass powder which enable to precipitate mullite crystalline phase, second step to be formed and a final step to fire the mixture at a temperature ranging from 850° C. to 1050° C., whereby the substrate results in eventually crystallizing a minimum of 40% by volume of mullite. However, the above-cited publication fails to disclose actual value of specific surface area of mullite powder and generation of crystalline phases other than the mullite phase present in the above-cited substrate. It is therefore hardly admissible that total degree of the crystallization of the substrate produced via a firing process is quite high. In consequence, even though the substrate has substantial strength at room temperature, its strength is degraded when being exposed to a temperature higher than 500° C. Therefore it generates critical problem during a process to bond lead wires with the substrate.

On the other hand, the U.S. Pat. No. 4,528,275 discloses a mullite-cordierite composite ceramic which would be useful for supporting substrate for a silicon chip built in a ceramic package installed in a computer unit. The composite ceramic disclosed in the above U.S. Patent is based on a ceramic sintering technique comprising; a step to form a uniform particulate mixture of $Al_2O_3$, MgO, $SiO_2$, and nucleating agent, a step to sinter the prepared mixture at a temperature ranging from about 1290° C. to about 1550° C. to produce a sintered body incorporating mullite phase and glassy cordierite phase, a step to perform a nucleation-annealing process at a temperature ranging from about 600° C. to about 800° C. to nucleate the glassy cordierite phase, and a final step to perform a crystallization-annealing process to precipitate crystalline cordierite at a temperature above 1200° C. and a certain temperature lower than that would generate liquid phase in the sintered body before eventually precipitating cordierite crystals. It is therefore quite apparent from the method prescribed in the U.S. Pat. No. 4,528,275 that co-firing of the above blended components in conjunction with Ag, Ag-Pd, Au, and Cu having low melting point is impracticable. As was disclosed in Example 11 of the above-cited U.S. Pat. No. 4,528,275, in order to co-fire all the blended components together, tungsten (W) having high melting point and high electrical-resistance value is compulsorily used for patterned conductor.

Furthermore, transparent glass-ceramic articles each containing mullite are disclosed in the U.S. Pat. Nos. 4,396,720, 4,519,828, and 4,526,873, respectively. The proposed glass-ceramic article is mainly used for laser material by doping $Cr^{3+}$ ion therein. In addition, the proposed glass-ceramic article has been developed so that it can internally be used for a luminescent solar collector by way of being combined with a silicon photovoltaic cell. It is expressly described in the above-identified patent publications that absence of crystalline phases other than mullite phase is preferable. Above all, no technical thought has ever been disclosed in each of those U.S. Patents publications cited above in order to use the proposed transparent glass-ceramic article to compose a substrate subject to a co-firing process under low temperature.

OBJECTS AND SUMMARY OF THE INVENTION

Therefore, it is an object of the present invention to provide a novel composition for producing a glass-ceramic substrate co-fired under low temperature so that a variety of problems incidental to the prior art are overcome.

A further object of the present invention is to provide a novel composition for producing a novel multilayer glass-ceramic substrate produced via a simultaneous process for firing the composition under low temperature, where the composition is co-fired in conjunction with conductive material having a low electrical-resistance such as Ag, Ag-Pd, Au, and/or Cu, and similar materials, at a temperature ranging from about 850° C. to about 1050° C.

Characteristically, after completing the firing process, the fired composition is internally provided with a wide variety of crystalline phases including mullite phase as main crystalline phase, cordierite phase, forsterite phase, spinel phase, sapphirine phase, and similar crystalline phases.

In consequence, an extremely solid substrate having a minimum of about 23 kgf/mm$^2$ of flexural strength can securely be produced. The novel substrate according to the invention has a sufficiently low dielectric constant rated under 7, thus effectively suppressing the signal delay. Further, the above substrate according to the present invention has a enough low lose factor (tan δ) to keep signal level.

More particularly, according to the present invention, a novel crystallizable glass composition for producing a novel glass-ceramic substrate, should be thermally crystallized, and comprises the following components expressed in terms of percent by weight on the oxide basis:

| $Al_2O_3$: | 45%–58% | $SiO_2$: | 20%–35% |
| $B_2O_3$: | 5%–15% | MgO: | 5%–20% |
| $Li_2O$: | 0%–2% | $Na_2O$: | 0%–2% |
| $K_2O$: | 0%–2% | | |

1%–4% of $R_2O$; wherein $R_2O$ is a combination of at least two oxides selected from the group consisting of $Li_2O$, $Na_2O$ and $K_2O$.

Above-mentioned novel crystallizable glass composition comprising above components is sinterd to produce the said substrate which comprises main crystalline phase consisting of mullite and a subordinate crystalline phase comprising one or more than one of forsterite, spinel, and sapphirine.

The sintered composition and the resultant substrate respectively exhibit about 50 through 70×10$^{-7}$/°C. of thermal expansion coefficient, which is close to that of alumina, and therefore, no problem can be generated when mounting semiconductor devices and LCR, and similar devices, thereon.

More particularly, according to the present invention a novel composition for producing a novel glass-ceramic substrate comprises 80% through 99.9% by weight of crystallizable glass powder and 0.1% through 20.0% by weight of inorganic filler having a minimum of 1.4 m$^2$/g of mean specific surface area.

Above-mentioned novel crystallizable glass powder comprises the following components expressed in terms of percent by weight on the oxide basis:

| $Al_2O_3$: | 45%–58% | $SiO_2$: | 20%–35% |
| $B_2O_3$: | 5%–15% | MgO: | 5%–20% |
| $Li_2O$: | 0%–2% | $Na_2O$: | 0%–2% |
| $K_2O$: | 0%–2% | | |

0%–4% of $R_2O$; wherein $R_2O$ is a combination of at least two oxides selected from the group consisting of $Li_2O$, $Na_2O$ and $K_2O$.

According to another embodiment of the present invention, in the course of heat treatment, the above-specified crystallizable glass powder is capable of precipitating mullite as the main crystalline phase, where inorganic filler component functions as external additive that precipitates cordierite in the direction of the interior of glass from interface which is in contact with the glass powder.

In consequence, thermal expansion coefficient can be controlled in a range from about 30 to about 55×10$^{-7}$/°C., and thus, thermal expansion coefficient of the composition embodied by the present invention is close to that of aluminum nitride having high thermal conductivity. Since residual stress is minimized when connecting aluminum nitride to the substrate embodied by the present invention, high reliability can be obtained.

The inorganic filler is at least one kind selected from the group consisting of silica glass, aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides, and similar compounds, and consisting of compounds such as carbonate, sulfate, and hydroxide, and similar compounds transformable into oxides after a heat treatment, and also consisting of clay minerals such as dolomite, talc, and kaolinite, and similar clay minerals, and also consisting of double oxides and solid solutions at least comprising two kinds of oxide components selected from the group consisting of $Al_2O_3$, $SiO_2$, $B_2O_3$, $P_2O_5$, MgO, CaO, SrO, BaO, ZnO, $ZrO_2$, $TiO_2$, $Li_2O$, $Na_2O$, $K_2O$, $Cr_2O_3$, CoO, CuO, $Fe_2O_3$, $MnO_2$, and similar oxide components.

Since coloring components respectively have shading property, coloring components mixed or contained in the above glass composition shield semiconductor devices mounted on the substrate from light and facilitate assembling the chip components on the substrate.

Furthermore, even when being exposed to temperature higher than 500° C. the novel substrate according to the present invention can preserve own strength without degradation at all, and yet, it can fully withstand stress generated in the course of connecting lead wires to the substrate.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
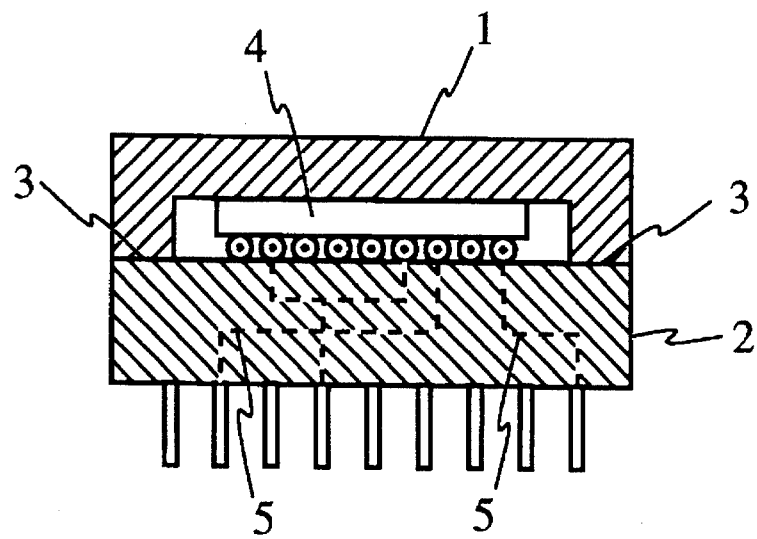
FIG. 1 is a cross-sectional view of an embodiment of a semiconductor-device package using the substrate according to the present invention complete with co-firing process under low temperature and also using aluminum nitride.

The present invention relates to a novel composition for consummating a novel substrate complete with co-firing process under low temperature, which has successfully been developed to overcome a variety of technical problems described earlier, and yet, the present invention also relates to the substrate based on the novel composition.

More particularly, the novel crystallizable glass composition comprises oxides by amounts respectively being expressed in terms of percent by weight on the oxide basis, which include the following;

| | | | |
|---|---|---|---|
| $Al_2O_3$: | 45%–58% | $SiO_2$: | 20%–35% |
| $B_2O_3$: | 5%–15% | MgO: | 5%–20% |
| $Li_2O$: | 0%–2% | $Na_2O$: | 0%–2% |
| $K_2O$: | 0%–2% | | |

1%–4% of $R_2O$; wherein $R_2O$ is a combination of at least two oxides selected from the group consisting of $Li_2O$, $Na_2O$ and $K_2O$.

It is a significant feature of the present invention that said novel crystallizable glass composition comprising above components is sintered to produce substrate which comprises main crystalline phase consisting of mullite and a subordinate crystalline phase comprising at least one kind selected from the group consisting of forsterite, spinel, and sapphirine.

It is another significant feature of the present invention to provide a novel crystallizable glass composition for producing a novel substrate complete with co-firing process under low temperature, wherein the composition is characterized by an additional component of at least one kind selected from the group consisting of copper oxides, vanadium oxides, iron oxides, nickel oxides, manganese oxides, or cobalt oxides, each functioning as coloring component, in the above-specified fundamental composition.

It is another significant feature of the present invention in that, subsequent to formation of the above fundamental composition or the one including one or more than one of the just before-specified coloring components therein, predetermined pattern is formed by means of conductive paste mainly comprising Ag, Ag-Pd, and/or Au, and then, the patterned crystallizable glass composition is fired in air before eventually yielding a white substrate or colored substrate complete with co-firing process under low temperature.

It is another significant feature of the present invention to provide a novel crystallizable glass composition for producing a novel substrate, which is characterized by an additional component of at least one kind selected from the group consisting of molybdenum oxides, tungsten oxides, iron oxides, nickel oxides, manganese oxides, and cobalt oxides, each functioning as coloring component, in the above-specified fundamental composition.

It is another significant feature of the present invention in that, subsequent to formation of the above-specified fundamental composition or the one including one or more than one of the just before-specified coloring components therein, predetermined pattern is formed by means of conductive paste mainly comprising Cu, and then, the patterned crystallizable glass composition is fired in reducing atmosphere containing hydrogen before eventually yielding a non-colored substrate or a colored substrate complete with co-firing process under low temperature.

It is another significant feature of the present invention to provide a novel crystallizable glass composition for producing a novel substrate, which is characterized by an additional component of at least one kind selected from the group consisting of vanadium oxides, molybdenum oxides, and iron oxides, each functioning as coloring component, in the above-specified fundamental composition.

It is another significant feature of the present invention in that, subsequent to formation of the above-specified fundamental composition or the one including one or more than one of the just before-specified coloring components therein, predetermined pattern is formed by means of conductive paste mainly comprising Ag, Ag-Pd, Au, and/or Cu, and then, the patterned crystallizable glass composition is fired in neutral atmosphere consisting of inert gas such as nitrogen before eventually yielding a white substrate or a colored substrate complete with co-firing process under low temperature.

It is another significant feature of the present invention to provide a novel crystallizable glass composition for producing a novel substrate, which is characterized by addition and mixing of at least one kind of coloring fillers selected from the group consisting of metal oxide powder, metal salt powder, and metal powder, wherein the metal component of said metal oxide powder, metal salt powder, and metal powder being at least one kind selected from the group consisting of copper, vanadium, iron, nickel, manganese, cobalt, to and with the above-specified fundamental composition.

It is another significant feature of the present invention in that, subsequent to formation of the above-specified composition to which one or more than one of the just before-cited coloring fillers is added, predetermined pattern is formed by means of conductive paste mainly comprising Ag, Ag-Pd, and/or Au, and then, the patterned crystallizable glass composition with the coloring filler is fired in air before eventually yielding a colored substrate complete with co-firing process under low temperature.

It is another significant feature of the present invention to provide a novel crystallizable glass composition for producing a novel substrate, which is characterized by addition and mixing of at least one kind of coloring fillers selected from the group consisting of metal oxide powder, metal salt powder, and metal powder, wherein the metal component of said metal oxide powder, metal salt powder, and metal powder being at least one kind selected from the group consisting of molybdenum, tungsten, iron, nickel, manganese, and cobalt, to and with the above-specified fundamental composition.

It is another significant feature of the present invention in that, subsequent to formation of the above-specified fundamental composition to which one or more than one of the just before-cited coloring fillers is added, predetermined pattern is formed by means of conductive paste mainly comprising Cu, and then, the patterned crystallizable glass composition with the coloring filler is fired in reducing atmosphere containing hydrogen before eventually yielding a colored substrate complete with co-firing process under low temperature.

It is another significant feature of the present invention to provide a novel crystallizable glass composition for producing a novel substrate, which is characterized by addition and mixing of at least one kind of coloring fillers selected from the group consisting of metal oxide powder, metal salt powder, and metal powder, wherein the metal component of said metal oxide powder, metal salt powder, and metal powder being at least one kind selected from the group consisting of vanadium, molybdenum, and iron, to and with the above-specified fundamental composition.

It is another significant feature of the present invention in that, subsequent to formation of the above-specified fundamental composition to which one or more than one of the just before-cited coloring fillers is added, predetermined pattern is formed by means of conductive paste mainly comprising Ag, Ag-Pd, Au, and/or Cu, and then, the patterned crystallizable glass composition with the coloring filler is fired in neutral atmosphere before eventually yielding a colored substrate complete with co-firing process under low temperature.

When using the above-mentioned combinations of those kinds of coloring components or fillers and firing atmospheres, it is most preferable. Because, when above-mentioned combinations are not used, the produced substrates are insufficiently colored and result in poor appearance. Consequently, the shading property of substrates becomes insufficient, and also assembling the chip components on the substrates becomes inconvenient. Therefore, coloring components or coloring fillers which make the substrate black are preferable while white substrate is also preferable because of its good appearance, and etc.

It is another significant feature of the present invention in that the novel substrate complete with co-firing process under low temperature constantly has a minimum of about 23 kgf/mm$^2$ of flexural strength.

It is another significant feature of the invention to provide a novel composition for producing a novel glass-ceramic substrate comprising 80% through 99.9% by weight of a crystallizable glass powder and 0.1% through 20% by weight of an inorganic filler having a minimum of 1.4 m$^2$/g of mean specific surface area. Oxide components of the crystallizable glass powder are shown below in terms of percent by weight;

| | | | |
|---|---|---|---|
| Al$_2$O$_3$: | 45%–58% | SiO$_2$: | 20%–35% |
| B$_2$O$_3$: | 5%–15% | MgO: | 5%–20% |
| Li$_2$O: | 0%–2% | Na$_2$O: | 0%–2% |
| K$_2$O: | 0%–2% | | |

0%–4% of R$_2$O; wherein R$_2$O is a combination of at least two oxides selected from the group consisting of Li$_2$O, Na$_2$O and K$_2$O.

In addition, it is another significant feature of the present invention in that the crystallizable glass powder used for the novel composition described above mainly precipitates mullite crystalline phase as a result of a heat treatment, where the inorganic filler is combined as external additive with the glass powder in order that cordierite can be precipitated in the direction of the interior of glass from the interface which is in contact with the glass powder in the course of execution of a heat treatment.

In addition, it is another significant feature of the present invention in that the inorganic filler is at least one kind selected from the group consisting of silica glass, aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides, and similar compounds, and consisting of compounds such as carbonate, sulfate, and hydroxide, and similar compounds, transformable into oxides after a heat treatment such as aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides, and similar oxides.

In addition, it is another significant feature of the present invention in that the inorganic filler is at least one kind selected from the group consisting of clay minerals such as dolomite, talc, and kaolinite, and similar clay minerals.

In addition, it is another significant feature of the present invention in that the inorganic filler is at least one kind selected from the group consisting of the double oxides and the solid solutions at least comprising two kinds of oxide component such as Al$_2$O$_3$, SiO$_2$, B$_2$O$_3$, P$_2$O$_5$, MgO, CaO, SrO, BaO, ZnO, ZrO$_2$, TiO$_2$, Li$_2$O, Na$_2$O, K$_2$O, Cr$_2$O$_3$, CoO, CuO, Fe$_2$O$_3$, MnO$_2$, and similar oxide components.

In addition, it is another significant feature of the present invention in that the inorganic filler is at least one kind selected from the group consisting of the double oxides and the solid solutions such as mullite, sillimanite, cordierite, wollastonite, forsterite, steatite, spinel, zircon, anorthite, celsian, eucryptite, spodumens, titanite, willemite, gahnite, enstatite, gehlenite, aluminum titanate, aluminum borate, and similar compounds.

In addition, it is a still further significant feature of the present invention in that the above-specified substrate produced by sintering the above-specified composition characteristically has at least both mullite phase and cordierite phase, about 30 through about 55×10$^{-7}$/°C. of thermal expansion coefficient, and a minimum of about 23 kgf/mm$^2$ of flexural strength, and yet, it is ideally suited for being combined with aluminum nitride (AlN).

Next, the components of the above-identified composition are described in detail below.

The crystallizable glass powder specifically used for the present invention is always crystallized by means of a heat treatment.

$Al_2O_3$ shares part of components of mullite ($3Al_2O_3 \cdot 2SiO_2$), cordierite ($2MgO \cdot 2Al_2O_3 \cdot 5SiO_2$), spinel ($MgO \cdot Al_2O_3$), and sapphirine ($4MgO \cdot 5Al_2O_3 \cdot 2SiO_2$), being present in glass-ceramic, and yet, $Al_2O_3$ is intermediate oxide of residual glass phase. Assume that less than 45% by weight of $Al_2O_3$ is present in the crystallizable glass composition, then, it will cause degree of crystallization to be lowered. Once this condition ever occurs, the substrate can hardly achieve about 23 kgf/mm² of flexural strength. Conversely, if there is more than 58% by weight of $Al_2O_3$ in the glass composition, then, it will in turn raise melting temperature of the glass to easily generate devitrification.

Likewise, $SiO_2$ shares part of components of mullite, cordierite, forsterite ($2MgO \cdot BiO_2$), and sapphirine present in the glass-ceramic, and yet, it forms network of residual glass phase. Assume that less than 20% by weight of $SiO_2$ is present in the glass composition, then, it will lower the strength of the substrate produced from this composition because of decreasing the degree of crystallization. Conversely, if the content of $SiO_2$ ever exceeds 35% by weight, then, it will also lower the strength of the substrate produced from this composition. This is because, in case that the content of $SiO_2$ ever exceeds 35% by weight, cordierite phase will be generated over the desired amount.

$B_2O_3$ is used for flux. Assume that less than 5% by weight of $B_2O_3$ is present in the glass composition, then, it will cause melting temperature of the glass to excessively rise. Conversely, if the content of $B_2O_3$ ever exceeds 15% by weight, then, it will cause the degree of crystallization to lower. In consequence, strength of the produced substrate will be lowered.

MgO shares part of components of cordierite, forsterite, spinal, and sapphirine present in the glass-ceramic, and in addition, it functions to lower melting temperature of the glass. Assume that less than 5% by weight of MgO is present in the glass, then, it will cause melting temperature of the glass to excessively rise, and yet, cause the degree of crystallization of the sintered composition to lower. This in turn lowers strength of the produced substrate. Conversely, if the content of MgO ever exceeds 20% by weight, then, it will cause phase separation to occur to result in the devitrification on the way of melting it.

In consequence, taking overall properties including strength, melting property, forming property, and proportional balance of crystalline phases into consideration, of those essential components for the above-specified crystallizable glass composition embodied by the present invention, it is preferable that the glass composition include the following; 47%–53% by weight of $Al_2O_3$, 24%–33% by weight of $SiO_2$, 5%–15% by weight of $B_2O_3$, and 7%–14% by weight of MgO. It is more preferable that glass composition include the following; 47%–51% by weight of $Al_2O_3$, 25%–30% by weight of $SiO_2$, 7%–13% by weight of $B_2O_3$, and 8%–12.5% by weight of MgO.

In case of melting the above-specified crystallizable glass composition by a directly electrical melting process where an electrical current directly flows through molten glass, it is economical since non-large amount of glass with high price can be made by a small apparatus and also the environment of melting glass composition can maintain clean.

However, under the electrical process in order to increase electrical conductivity of molten glass under high temperature, one or more than one kind of $R_2O$ component selected from the group consisting of $Li_2O$, $Na_2O$ and $K_2O$ must be contained in the above-specified glass composition, when $R_2O$ component is contained in said glass composition, the properties of produced substrate results in increase of loss factor (tan δ) and decrease of insulation resistance which phenomena are not desired for the substrate.

In case of being contained $R_2O$, if sole component of $R_2O$ is used, then, it will cause loss factor to greatly increase, and also insulation resistance to greatly decrease.

However, when two components of $R_2O$ are contained in the crystallizable glass composition, the above phenomena of the produced substrate are considerably suppressed by mixed-alkali effect.

Further, when all kinds of $R_2O$, namely $Li_2O$, $Na_2O$ and $K_2O$ are contained as components, the above phenomena of the produced substrate are more considerably suppressed by mixed-alkali effect.

Therefore, mixed-alkali effect of two or three kinds of $R_2O$ components considerably prevents properties of the produced substrate from degradation.

If less than 1% by total weight of $R_2O$ components are contained in the above-specified glass composition, then, it will result in the lost function of $R_2O$ components as electric charge carriers, whereby it can be hardly used an electrical melting process.

Conversely, if the total amount of $R_2O$ components exceed 4% by weight, then, it not only causes excessively increase of the loss factor (tan δ) and decrease the insulation resistance, but also a thermal expansion coefficient is excessively increased. On the other hand, if the individual amount of $Li_2O$, $Na_2O$, or $K_2O$ exceeds 2% by weight, then, it causes excessively increase of the loss factor (tan δ) and decrease of the insulation resistance.

Based on those reasons described above, when executing an electrical melting process, it is desired that the total amount of $R_2O$ components is defined in a range from 1% by weight to 4% by weight, and also, the individual amount of $Li_2O$, $Na_2O$, or $K_2O$ is at most 2% by weight.

It is more preferable that the total amount of $R_2O$ components is defined in a range from 1% by weight to 3% by weight.

And yet, it is preferable that two or three kinds of $R_2O$ components are respectively contained at least 0.3% by weight in the glass composition.

When using two of the above oxides for composing $R_2O$, any of these oxides may optionally be combined to make up two components. However, in order that the mixed-alkali effect can be maximized, it is preferable that $Li_2O$ is combined with $K_2O$. Most significant effect can be exerted by containing all the three components of $R_2O$ including LiO, $Na_2O$, and $K_2O$.

When melting the crystallizable glass composition by applying a technique other than the directly electrical melting process, although said technique is difficult to make clear environment of melting and also is usually necessary to make a big plant, the $R_2O$ components may not necessarily be contained in the composition. Absence of $R_2O$ in the glass composition of course prevents loss factor (tan δ) from increasing and insulation resistance from decreasing.

In the mean time, when small amount below 4% by weight of $R_2O$ are contained, it can become flux although the above disadvantage of substrate properties remains, when $R_2O$ are contained as flux, it is more preferable that the total amount of $R_2O$ components is defined in a range from 0.5% by weight to 3% by weight, and more preferably from 1% by weight to 3% by weight.

In addition to the above-specified fundamental components, as part of crystallizable glass components, a total of 0.1% through 5% by weight of coloring component may be contained in the abovespecified composition.

Oxides of iron, nickel, copper, vanadium, manganese, and cobalt, respectively make up coloring component when firing the above glass composition in air.

On the other hand, oxides of molybdenum, tungsten, iron, nickel, manganese, and cobalt, respectively make up coloring component when firing the above glass composition in reducing atmosphere containing hydrogen.

On the other hand, oxides of molybdenum, iron, and vanadium, respectively make up coloring component when firing the above glass composition in neutral atmosphere consisting of inert gas such as nitrogen.

If total amount of coloring component are less than 0.1% by weight, then, the coloring effect will be quite insufficient, thus resulting in the poor appearance of the substrates. Conversely, if total amount of coloring component exceeds 5% by weight, then, it will cause sintering property to be lowered to eventually result in the lowered strength of the produced substrates.

It is more preferable that the total amount of coloring components is 0.5% through 4% by weight.

As described above, even when, instead of one or more than one of the above-specified coloring components as glass component, adding filler to the above-specified glass composition, as much satisfactory effect as that is achieved for the preceding case can be generated. When adding and mixing one or more than one of the above-specified coloring components as filler to and with the basic crystallizable glass composition, one or more than one of metal oxide powder, metal salt powder such as carbonate, sulfate, and hydroxide, and metal powder may be used.

If a coloring component as filler has desired specific surface area, then, the coloring component itself also serves as external additive as described later on.

It is desired that the ratio of coloring filler to the glass composition is 0.1 through 5 parts by weight to 100 parts by weight.

It is more preferable that said ratio is 0.5 through 4 parts by weight to 100 parts by weight.

In order to promote melting property, CaO, BaO, and/or ZnO may be contained in the above-specified crystallizable glass composition by a maximum of 3% by weight in all.

To promote crystallization, nuclear-forming agent such as $ZrO_2$ and $SnO_2$ may be contained in the above-specified glass composition by a maximum of 5% by weight in all.

A maximum of 5% by weight of $F_2$ concurrently functioning as nuclear-forming agent and flux may also be contained in the glass composition.

Next, functions of inorganic filler having a minimum of 1.4 $m^2/g$ of mean specific surface area is described below.

Those inorganic fillers specified in the preceding description are respectively external additive, and yet, precipitate cordierite phase in the direction of the interior of crystallizable glass from the interface which is in contact with the glass powder. Therefore, by adding one or more than one of the above-specified inorganic fillers, thermal expansion coefficient of the above-specified substrate can be controlled at a low value, and yet, strength of the substrate can also be increased.

When using less than 0.1% by weight of selected inorganic fillers or when non-using them, mullite mainly shares crystalline phase in the substrate, whereas forsterite, spinel, and/or sapphirine share subordinate crystalline phase. In consequence, the substrate has about 50 through about $70 \times 10^{-7}/°C$. of thermal expansion coefficient, which is close to that of an alumina substrate, but, being greater than that of aluminum nitride (AlN). The substrate using less than 0.1% by weight of inorganic fillers can of course be used instead of alumina substrate while it can not be used with aluminum nitride heat sinks.

When using 0.1% through 20% by weight of selected inorganic fillers, not only the main and subordinate crystalline phases mentioned above, but the cordierite crystalline phase having lower thermal expansion coefficient is also extremely precipitated, so that a thermal expansion coefficient of the produced substrate can be controlled in a range from about 30 to about $55 \times 10^{-7}/°C$., thus achieving a satisfactory value approximating to that of aluminum nitride (AlN). Simultaneous with precipitation of cordierite, precipitated amount of mullite increases to promote total degree of crystallization to eventually promote strength of the produced substrate. When using more than 20% by weight of inorganic fillers, the sintering property will be degraded to result in the difficulty to densely sinter the composition at a temperature below about 1050° C.

When producing the substrate with low thermal expansion coefficient containing both the mullite and cordierite crystalline phases, considering volume balance of mullite and cordierite, it is preferable that 1% through 15% by weight of the selected inorganic fillers are used for producing the substrate.

It is more preferable that 3% through 12% by weight of said fillers are used.

Since one or more than one of the above-cited inorganic fillers serve as external additive, it is desired that usable inorganic filler has substantial area in contact with crystallizable glass powder. To lower thermal expansion coefficient by causing a sufficient amount of cordierite crystalline phase to precipitate in the direction of the interior of the glass from interface which is in contact with the glass powder, it is essential that mean specific surface area of the introduced inorganic fillers is at least 1.4 $m^2/g$. Furthermore, taking forming property of a greensheet and sintering property into consideration, it is preferable that mean specific surface area of inorganic fillers is at most 10 $m^2/g$. It is more preferable that mean specific surface area of fillers is at most 7 $m^2/g$.

It is desired that usable inorganic filler shall not cause electrical property of the produced substrate to be adversely effected at all.

Further, it is desired that usable inorganic filler is free from individually being melted throughout the whole firing temperature range predetermined for producing the substrate.

And yet, it is desired that even though usable inorganic fillers are decomposed in the course of above firing process to result in solid products and gaseous products. The solid products are also free from being melted in the firing process. Aluminum hydroxide is one example of said fillers, and is decomposed into alumina and water vapor in the course of firing while remaining alumina being not melted throughout the whole firing temperature range predetermined.

The inorganic fillers specified for use comprise at least one kind selected from the group consisting of silica glass, aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides, and similar components, and also consisting of compounds such as carbonate, sulfate, and hydroxide, and similar compounds, transformable into oxides after a heat treatment such as aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides, and similar oxides.

In addition, the inorganic filler comprises at least one kind selected from the group consisting of clay minerals such as dolomite, talc, and kaolinite, and similar clay minerals.

In addition, the inorganic filler comprises at least one kind selected from the group consisting of the double oxides and the solid solutions at least comprising two kinds of oxide component such as $Al_2O_3$, $SiO_2$, $B_2O_3$, $P_2O_5$, MgO, CaO, SrO, BaO, ZnO, $ZrO_2$, $TiO_2$, $Li_2O$, $Na_2O$, $K_2O$, $Cr_2O_3$, CoD, CuD, $Fe_2O_3$, and $MnO_2$, and similar oxide components.

In case of using the double oxides and the solid solutions for inorganic fillers, considering a variety of filler properties such as strength, thermal expansion coefficient, dielectric constant, loss factor, insulation resistance, and some properties, it is preferable that the said fillers are mullite, sillimanite, cordierite, wollastonite, forsterite, steatite, spinal, zircon, anorthite, celsian, eucryptite, spodumene, titanite, willemite, gahnite, enstatite, gehlenite, aluminum titanate, aluminum borate, and similar compounds.

Zirconia ($ZrO_2$) includes partially stabilized zirconia and stabilized zirconia.

Considering a variety of filler properties such as strength, thermal expansion coefficient, dielectric constant, loss factor, insulation resistance, and some properties, more preferable fillers among above are as follows:

aluminum oxides, silicon oxides, titanium oxides, chromium oxides, talc, kaolinite, mullite, sillimanite, cordierits, wollastonite, forsterite, steatite, spinal, zircon, anorthite, celsian, aluminum borate.

Further, most preferable fillers among above fillers are aluminum oxides, mullite, cordierite. Selecting variety of inorganic fillers, amount of fillers and/or glass composition mentioned above, various thermal expansion coefficient of the produced substrate can be controlled.

The present invention is illustrated in more detail by reference to the example described hereinafter.

EXAMPLES AND COMPARATIVE EXAMPLES

In order to achieve the objective crystallizable glass compositions shown in the accompanying Tables, applying the conventional method, predetermined raw materials were respectively weighed and mixed into a batch. The prepared batch was then melted into molten glass at a predetermined temperature degree shown in the accompanying Tables for 2 to 3 hours. Next, glass flakes were made from molten glass by means of a water-cooled twin roller. Next, glass flakes were pulverized into fine crystallisable glass powders with a ball mill for example, where average particle size was about 2 through about 5 micro meters.

When coloring component as filler should be added, the coloring component was mixed with the fine crystallizable glass powders to yield fine powder composition for producing the objective substrate for embodying the present invention by executing a firing process under low temperature.

When producing the another objective substrate having low thermal expansion coefficient, inorganic filler having a minimum of 1.4 $m^2/g$ of mean specific surface area was added to the prepared the crystallizable glass powders, whereby yielding fine powder composition for producing the objective substrate for embodying the present invention by executing a firing process under low temperature.

The objective substrate for embodying the present invention was produced by executing those sequential steps including the following: Initially, fine powder compositions were dispersed in a ball mill with solvent such as toluene or ethanol, and then, the mixture was converted into slurry after being added with binder such as polyvinyl butyral or polyacrylic ester, and plasticizer such as dibutyl phthalate (DBP) or dioctyl phthalate (DOP), and then, the blended slurry was formed into a greensheet by means of a doctor blade method. The greensheet was then cut off, and then sheets were stacked. The stacked greensheet was then fired in air, or in reducing atmosphere containing hydrogen, or in neutral atmosphere at a predetermined temperature ranging from 850° C. to 1050° C. after raising temperature until the predetermined firing temperature at a rate of 200° C./h. After firing the stacked sheets for 2 hours, the firing temperature was lowered into room temperature at a rate of 200° C./h., the objective substrate for embodying the present invention was eventually produced. Based on those methods described later on, dielectric constant, lose factor (tan δ), and insulation resistance, of the produced substrates were respectively evaluated. The results are shown in Tables 1 through 6 (for Examples A), Tables 7 and 8 (for Comparative Examples A), Tables 9 through 11 (for Examples B), and Tables 12 and 13 (for Comparative Examples B1).

Furthermore, based on the method exactly identical to that was executed for the above Examples B, substrates were produced by low temperature firing from composition blended with inorganic filler having less than 1.4 $m^2/g$ of mean specific surface area. Dielectric constant, loss factor-(tan δ), and insulation resistance, of the produced substrates were also evaluated. The results are shown in Table 14 (for Comparative Examples B2).

Furthermore, using fine powder compositions shown in the above Examples and Comparative Examples, differential thermal analysis (DTA), thermal expansion coefficients, crystalline phases, and flexural strength, were respectively evaluated. The results are shown in Table 1 through 6 (for Examples A), Tables 7 and 8 (for Comparative Examples A), Tables 9 through 11 (for Examples B), Tables 12 and 13 (for Comparative Examples B1), and Table 14 (for Comparative Examples B2), respectively.

Those substrates produced from Examples B exhibited more than 80% by volume of degree of crystallization. Because of the outstanding degree of crystallization, the substrates produced from Examples B maintained high strength not only at room temperature, but also at a temperature higher than 500° C.

Applied test methods include the following:
(1) Re: Dielectric constant and loss factor(tan δ)

The produced substrate were patterned with an electrically conductive material, then, dielectric constant and loss factor (tan δ) were respectively evaluated at 25° C., 60% of relative humidity (RH), and at 1 MHz, by means of an impedance meter.
(2) Re: Insulation resistance In the same way, patterned substrates were prepared, then, these were tested to evaluate insulation resistance at 25° C., 60% RH, and at 50 V by means of a resistance meter.
(3) Re: Differential thermal analysis (DTA)

After placing each 500 mg sample of fine powder compositions in respective sample holders, these samples were respectively raised from room temperature to 1000° C. at a rate of 20° C./min. by means of DTA apparatus. Then, glass transition point, softening point, and peak of crystallization temperature were evaluated from the obtained DTA curve.

(4) Re: Thermal expansion coefficient

Using a pelleter, each sample of fine powder compositions was pressed into a bar-shaped piece. The bar-shaped samples were then raised until crystallization temperature measured from DTA curve at a rate of 200° C./h., and then, the samples were sintered during holding at the crystallization temperature for 2 hours. Then, sintered samples were again raised from room temperature to 1000° C. at a rate of 10° C./min. by means of thermal mechanical analysis apparatus, whereby thermal expansion coefficient of those sintered samples were determined as mean value in a temperature range from 30° C. to 400° C.

(5) Re: Crystalline phase and degree of crystallization

After again pulverizing the above bar-shaped sintered samples into fine crystallized powders, the sample was analyzed to evaluate crystalline phases and degree of crystallization by applying X-ray diffraction method.

(6) Re: Flexural strength

In accordance with JIS-R1601, above bar-shaped sintered samples were processed, and then, flexural strength of the processed bar-shaped samples were evaluated by means of three points bending.

(7) Re: Flexural strength at high temperature

In accordance with JIS-R1601, flexural strength of the above processed bar-shaped samples were evaluated by means of three points bending at a temperature ranging from about 300° C. to about 1000° C.

Further, using fine powder compositions having the composition shown in the above description of Examples A or B, multilayer glass-ceramic substrate samples were produced as follows.

Via-holes were formed in the greensheet by punching. Next, the via-holes were filled with electrically conductive paste comprising low electrical-resistance metallic powder such as Ag, Ag-Pd, Au, and/or Cu, by means of a screen-printing process. Then, predetermined patterns were printed with the above conductive paste to form desired circuit.

Next, plural patterned layers of the greensheets were stacked by applying heat press, and then, the stacked layers were cut off before being subject to a firing process.

When using conductive paste comprising Ag, Ag-Pd, and/or Au, a burn-out process was executed to fully remove binder component in air, or in neutral atmosphere, at a temperature ranging from about 300° C. to about 600° C. for an hour to three hours. Then, a nuclear-forming process was executed in the same atmosphere at a temperature ranging from about 700° C. to about 750° C. for thirty minutes to three hours. And then, a sintering process was executed in the same atmosphere at a predetermined temperature ranging from about 850° C. to about 1050° C. for an hour to three hours, whereby multilayer glass-ceramic substrates were produced.

On the other hand, when using conductive paste comprising Cu, a burn-out process was executed to fully remove binder component in slightly oxidative atmosphere or in non-oxidizing atmosphere, at a temperature ranging from about 300° C. to about 600° C. for an hour to three hours.

Then, in order to prevent Cu conductor from being oxidized, a nuclear-forming process was executed in reducing atmosphere containing hydrogen, or in neutral atmosphere, at a temperature ranging from about 700° C. to about 750° C. for thirty minutes to three hours. And then, a sintering process was executed in the same atmosphere at a predetermined temperature ranging from about 850° C. to about 1050° C. for an hour to three hours.

In the above processes, the rate of raising temperature was from 100° C./h. to 200° C./h.

It was evidenced that those multilayer glass-ceramic substrates fired under low temperature based on the above method with the above processes respectively exhibited low electrical-resistance of the printed pattern and sufficient adhesive strength between the substrate layer and the conductive layer.

In addition, solderability of conductor also proved to be satisfactory, consequently, solid bonding of lead wires with the conductor became possible.

Next, as another Example of the present invention, a method of producing two types of composite ceramic package incorporating the novel substrate fired under low temperature according to Examples B is described below. This ceramic package has a part comprising aluminum nitride (AlN) for mounting a high-speed LSI device thereon.

After completing a press-forming process and a sintering process, an AlN cap 1 shown in FIG. 1 was metallized with Mo-Mn, and then, plated with nickel and gold. In addition, gold-plated film was formed on a sealed area 3 of the substrate 2 completed with a firing process under low temperature. Next, a semiconductor device 4 such as high-speed LSI was attached to the metallized cap 1 with solder, and then, the area 3 was sealed with solder.

Figure 2:
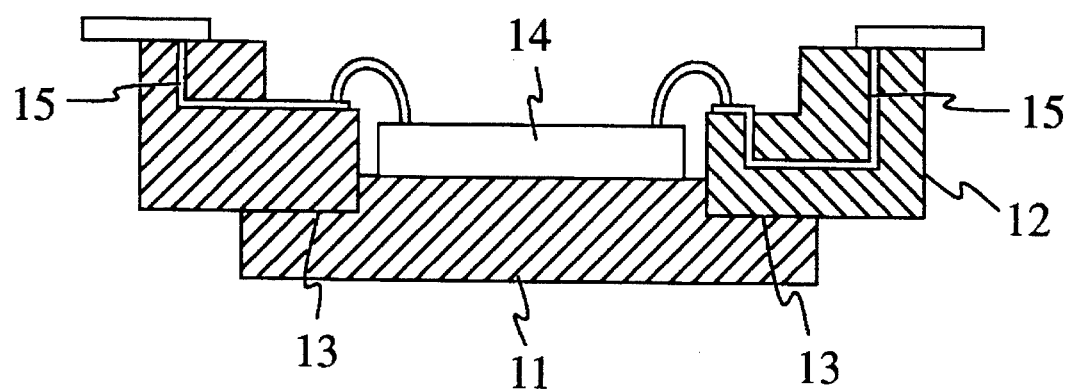
FIG. 2 is a cross-sectional view of another embodiment of a semiconductor-device package using the substrate according to the present invention complete with co-firing process under low temperature and also using aluminum nitride.

As shown in FIG. 2, surface of the AlN base 11 completed with the press-forming process and the firing process described above is previously oxidized. On the other hand, contact area 13 between the substrate 12 fired under low temperature and the AlN base 11 is printed with borosilicate glass, and then, these devices are combined together by melting glass in neutral atmosphere consisting of inert gas being heated at about 500° C. Finally, a semiconductor device 14 is mounted on the AlN base 11.

When using the package according to the present invention shown in FIGS. 1 and 2, heat from the semiconductor devices 4 and 14 can effectively be discharged via the AlN cap 1 and the AlN base 11. At the same time, because of low dielectric constant of the substrates 2 and 12 fired under low temperature, and because of low electrical-resistance of patterned conductors 5 and 15, highly integrated semiconductor devices capable of operating themselves at an extremely high speed can be sealed hermetically.

Having described preferred embodiments of the invention with reference to the accompanying drawings, it is to be understood that the present invention is not limited to the precise embodiments and that various changes and modifications may be affected therein by one skilled in the art without departing from the scope or spirit of the present invention which is limited only by the appended claims.

TABLE 1

| | (EXAMPLES A) | | | | |
|---|---|---|---|---|---|
| | (1) | (2) | (3) | (4) | (5) |
| GLASS COMPOSITION | | | | | |
| $Al_2O_3$ | 50.0 | 50.0 | 45.0 | 50.0 | 57.0 |
| $SiO_2$ | 25.0 | 20.0 | 25.0 | 34.5 | 26.0 |
| $B_2O_3$ | 10.5 | 13.0 | 15.0 | 7.0 | 6.0 |
| MgO | 11.5 | 13.7 | 12.5 | 6.0 | 7.0 |
| $R_2O$ | | | | | |
| $Li_2O$ | 0.7 | 0.7 | — | 0.7 | 1.0 |
| $Na_2O$ | 0.7 | 0.7 | 0.5 | 0.7 | — |
| $K_2O$ | 0.5 | 0.6 | 0.5 | 0.6 | 1.0 |
| $Fe_2O_3$/NiO | 0.5/0.3 | — | — | — | — |
| CuO/$V_2O_5$ | 0.2/— | 0.5/0.5 | — | — | — |
| $MnO_2$/CoO | — | — | 1.0/0.5 | — | — |
| $NO_3$/$MoO_3$ | — | — | — | 0.3/0.2 | —/2.0 |
| CaO | — | 0.3 | — | — | — |
| $SnO_2$ | — | — | — | — | — |
| Glass melting temperature (°C.) | 1555 | 1550 | 1550 | 1585 | 1500 |
| DTA | | | | | |
| Glass transition point (°C.) | 696 | 675 | 687 | 710 | 705 |
| Glass softening point (°C.) | 815 | 790 | 805 | 842 | 833 |
| Peak of crystallization temp. (°C.) | 917 | 899 | 908 | 948 | 931 |
| TMA | | | | | |
| Thermal expansion coefficient: (30–400° C.) ($\times 10^{-7}$/°C.) | 62 | 54 | 59 | 57 | 51 |
| Crystalline Phase | | | | | |
| Main: Mallite | ○ | ○ | ○ | ○ | ○ |
| Sub.: Spinel | ○ | ○ | ○ | — | — |
| Sub.: Forsterite | ○ | ○ | ○ | ○ | ○ |
| Sub.: Sapphirine | — | — | — | — | ○ |
| Flexural strength (kgf/mm$^2$) | 24 | 24 | 23 | 24 | 25 |
| Insulation resistance (Ω.cm) | >10$^{14}$ | >10$^{14}$ | >10$^{14}$ | >10$^{14}$ | >10$^{14}$ |
| Dielectric constant | 6.5 | 5.6 | 6.5 | 6.4 | 6.4 |
| Loss factor: tanδ ($\times 10^{-4}$) | 15 | 15 | 18 | 15 | 19 |
| Firing atmosphere | Air | Air | $N_2$—$H_2$ | $N_2$—$H_2$ | $N_2$ |
| Color of substrate | Black | Black | Black | Black | Black |

40

TABLE 2

| | (EXAMPLES A) | | | | |
|---|---|---|---|---|---|
| | (6) | (7) | (8) | (9) | (10) |
| GLASS COMPOSITION | | | | | |
| $Al_2O_3$ wt % | 48.0 | 49.0 | 47.0 | 48.0 | 53.0 |
| $SiO_2$ | 24.0 | 25.0 | 29.0 | 21.0 | 25.0 |
| $B_2O_3$ | 7.0 | 11.0 | 11.0 | 12.0 | 5.0 |
| MgO | 19.0 | 10.0 | 11.0 | 16.0 | 10.0 |
| $R_2O$ | | | | | |
| $Li_2O$ | 1.0 | — | 0.5 | 0.7 | 0.7 |
| $Na_2O$ | 1.0 | 1.0 | 0.5 | 0.5 | 0.7 |
| $K_2O$ | — | 1.0 | 0.7 | 0.6 | 0.6 |
| $Fe_2O_3$/NiO | — | — | — | 0.1/— | 0.3/0.2 |
| CuO/$V_2O_5$ | — | — | — | —/1.0 | 0.2/0.1 |
| $MnO_2$/CoO | — | 2.0/— | 0.1/— | — | —/0.2 |
| $NO_3$/$MoO_3$ | — | — | — | — | — |
| CaO | — | — | — | — | — |
| $SnO_2$ | — | — | — | — | — |
| Glass melting temperature (°C.) | 1570 | 1560 | 1550 | 1555 | 1585 |
| DTA | | | | | |
| Glass transition point (°C.) | 590 | 696 | 695 | 673 | 705 |

TABLE 2-continued

| | (EXAMPLES A) | | | | |
|---|---|---|---|---|---|
| | (6) | (7) | (8) | (9) | (10) |
| Glass softening point (°C.) | 811 | 814 | 824 | 790 | 332 |
| Peak of crystallization temp. (°C.) | 902 | 908 | 917 | 875 | 924 |
| TMA | | | | | |
| Thermal expansion coefficient: (30–400° C.) ($\times 10^{-7}$/°C.) | 63 | 60 | 58 | 54 | 51 |
| Crystalline Phase | | | | | |
| Main: Mullite | ○ | ○ | ○ | ○ | ○ |
| Sub.: Spinel | ○ | ○ | ○ | ○ | ○ |
| Sub.: Forsterite | — | ○ | ○ | — | ○ |
| Sub.: Sapphirine | — | — | — | — | ○ |
| Flexural strength (kgf/mm$^2$) | 23 | 24 | 23 | 23 | 26 |
| Insulation resistance (Ω.cm) | >10$^{14}$ | >10$^{14}$ | >10$^{14}$ | >10$^{14}$ | >10$^{14}$ |
| Dielectric constant | 6.7 | 5.6 | 6.6 | 6.7 | 6.5 |
| Loss factor: tanδ ($\times 10^{-4}$) | 19 | 18 | 15 | 15 | 15 |
| Firing atmosphere | Air | Air | N$_2$—H$_2$ | N$_2$ | Air |
| Color of substrate | White | Black | Black | Black | Black |

TABLE 3

| | (EXAMPLES A) | | | | |
|---|---|---|---|---|---|
| | (11) | (12) | (13) | (14) | (15) |
| GLASS COMPOSITION | | | | | |
| Al$_2$O$_3$ wt % | 54.0 | 55.0 | 51.0 | 47.0 | 49.0 |
| SiO$_2$ | 21.0 | 28.0 | 26.0 | 32.0 | 26.0 |
| B$_2$O$_3$ | 11.0 | 8.0 | 7.0 | 8.0 | 11.0 |
| MgO | 7.0 | 7.5 | 9.0 | 5.0 | 10.0 |
| R$_2$O | | | | | |
| Li$_2$O | 0.7 | 0.7 | 0.7 | 1.0 | — |
| Na$_2$O | 0.7 | 0.7 | 0.7 | 2.0 | 1.0 |
| K$_2$O | 0.5 | 0.5 | 0.6 | 1.0 | 1.0 |
| Fe$_2$O$_3$/NiO | — | — | — | 0.5/0.5 | —/2.0 |
| CuO/V$_2$O$_5$ | — | —/0.5 | — | — | — |
| MnO$_2$/CoO | — | — | 1.0/2.0 | — | — |
| WO$_3$/MoO$_3$ | —/5.0 | —/4.0 | 1.0/1.0 | — | — |
| CaO | — | — | — | — | — |
| SnO$_2$ | — | — | — | — | — |
| Glass melting temperature (°C.) | 1570 | 1560 | 1565 | 1550 | 1555 |
| DTA | | | | | |
| Glass transition point (°C.) | 695 | 701 | 700 | 565 | 538 |
| Glass softening point (°C.) | 816 | 829 | 824 | 781 | 820 |
| Peak of crystallization temp. (°C.) | 916 | 931 | 923 | 889 | 911 |
| TMA | | | | | |
| Thermal expansion coefficient: (30–400° C.) ($\times 10^{-7}$/°C.) | 64 | 59 | 60 | 54 | 61 |
| Crystalline Phase | | | | | |
| Main: Mullite | ○ | ○ | ○ | ○ | ○ |
| Sub.: Spinel | — | — | ○ | ○ | ○ |
| Sub.: Forsterite | ○ | ○ | ○ | ○ | ○ |
| Sub.: Sapphirine | ○ | — | — | — | — |
| Flexural strength (kgf/mm$^2$) | 25 | 24 | 25 | 23 | 24 |
| Insulation resistance (Ω.cm) | >10$^{14}$ | >10$^{14}$ | >10$^{14}$ | >10$^{14}$ | >10$^{14}$ |
| Dielectric constant | 5.5 | 5.5 | 6.6 | 6.6 | 6.6 |
| Loss factor: tanδ ($\times 10^{-4}$) | 15 | 15 | 15 | 20 | 18 |
| Firing atmosphere | N$_2$—H$_2$ | N$_2$ | N$_2$—H$_2$ | N$_2$—H$_2$ | N$_2$—H$_2$ |
| Color of substrate | Black | Black | Black | Black | Black |

TABLE 4

(EXAMPLES A)

| | (16) | | (17) |
|---|---|---|---|
| GLASS COMPOSITION | | | |
| $Al_2O_3$ wt % | 50.5 | ← | 50.0 |
| $SiO_2$ | 32.0 | ← | 24.0 |
| $B_2O_3$ | 7.0 | ← | 10.0 |
| MgO | 7.0 | ← | 9.0 |
| $R_2O$ | | | |
| $Li_2O$ | 0.6 | ← | 0.7 |
| $Na_2O$ | 0.7 | ← | 0.7 |
| $K_2O$ | 0.7 | ← | 0.6 |
| $Fe_2O_3/Ni_2O_3$ | —/1.0 | ← | — |
| $CuO/V_2O_5$ | — | ← | — |
| $MnO_2/CoO$ | — | $MnO_2/Co_3O_4$ | —/5.0 |
| $WO_3/MoO_3$ | — | ← | — |
| CaO | — | ← | — |
| $SnO_2$ | 0.5 | ← | — |
| Glass melting temperature (°C.) | 1580 | ← | 1560 |
| DTA | | | |
| Glass transition point (°C.) | 703 | ← | 686 |
| Glass softening point (°C.) | 835 | ← | 807 |
| Peak of crystallization temp. (°C.) | 939 | ← | 903 |
| TMA | | | |
| Thermal expansion coefficient: (30–400° C.) ($\times 10^{-7}$/°C.) | 59 | ← | 62 |
| Crystalline Phase | | | |
| Main: Mullite | ◯ | ← | ◯ |
| Sub.: Spinel | — | ← | ◯ |
| Sub.: Forsterite | ◯ | ← | ◯ |
| Sub.: Sapphirine | — | ← | — |
| Flexural strength ($kgf/mm^2$) | 24 | ← | 24 |
| Insulation resistance ($\Omega$.cm) | $>10^{14}$ | ← | $>10^{14}$ |
| Dielectric constant | 6.5 | ← | 6.6 |
| Loss factor: $\tan\delta$ ($\times 10^{-4}$) | 15 | ← | 15 |
| Firing atmosphere | Air | ← | $N_2$—$H_2$ |
| Color of substrate | Black | ← | B. Black |

*B. Black: Bluish Black

TABLE 5

(EXAMPLES A)

| | (18) | | (19) | (20) |
|---|---|---|---|---|
| GLASS COMPOSITION | | | | |
| $Al_2O_3$ wt % | 47.5 | ← | 47.5 | 47.5 |
| $SiO_2$ | 32.0 | ← | 32.0 | 32.0 |
| $B_2O_3$ | 8.5 | ← | 8.5 | 8.5 |
| MgO | 8.0 | ← | 8.0 | 8.0 |
| $R_2O$ | | | | |
| $Li_2O$ | 1.0 | ← | 1.0 | 1.0 |
| $Na_2O$ | 2.0 | ← | 2.0 | 2.0 |
| $K_2O$ | 1.0 | ← | 1.0 | 1.0 |
| FILLER | | | | |
| $Fe_2O_3/Ni_2O$ (parts by weight) | 0.5/0.5 | $Fe_2O_3/Ni_2O_3$ | — | — |
| $CuO/V_2O_5$ | — | ← | — | —/0.2 |
| $MnO_2/CoO$ | — | $MnO_2/Co_3O_4$ | — | — |
| $WO_3/MoO_3$ | — | ← | 0.5/0.5 | —/0.8 |
| CaO | — | ← | — | — |
| $SnO_2$ | — | ← | — | 13 |
| Glass melting temperature (°C.) | 1550 | ← | 1550 | 1550 |
| DTA | | | | |
| Glass transition point (°C.) | 666 | ← | 666 | 666 |
| Glass softening point (°C.) | 778 | ← | 778 | 778 |
| Peak of crystallization temp. (°C.) | 890 | ← | 890 | 890 |
| TMA | | | | |
| Thermal expansion coefficient: (30–400° C.) ($\times 10^{-7}$/°C.) | 54 | ← | 54 | 54 |
| Crystalline Phase | | | | |
| Main: Mullite | ◯ | ← | ◯ | ◯ |
| Sub.: Spinel | ◯ | ← | ◯ | ◯ |
| Sub.: Forsterite | ◯ | ← | ◯ | ◯ |
| Sub.: Sapphirine | — | ← | — | — |
| Flexural strength ($kgf/mm^2$) | 23 | ← | 23 | 23 |
| Insulation resistance ($\Omega$.cm) | $>10^{14}$ | ← | $>10^{14}$ | $>10^{14}$ |
| Dielectric constant | 6.6 | ← | 6.6 | 6.6 |
| Loss factor: $\tan\delta$ ($\times 10^{-4}$) | 20 | ← | 20 | 20 |
| Firing atmosphere | Air | ← | $N_2$—$H_2$ | $N_2$ |
| Color of substrate | Black | ← | Black | Black |

TABLE 6

| | (EXAMPLES A) | | | |
|---|---|---|---|---|
| | (21) | | (22) | (23) |
| GLASS COMPOSITION | | | | |
| $Al_2O_3$ wt % | 47.5 | ← | 47.5 | 47.5 |
| $SiO_2$ | 32.0 | ← | 32.0 | 32.0 |
| $B_2O_3$ | 8.5 | ← | 8.5 | 8.5 |
| MgO | 8.0 | ← | 8.0 | 8.0 |
| $R_2O$ | | | | |
| $Li_2O$ | 1.0 | ← | 1.0 | 1.0 |
| $Na_2O$ | 2.0 | ← | 2.0 | 2.0 |
| $K_2O$ | 1.0 | ← | 1.0 | 1.0 |
| FILLER | | | | |
| $NiCO_3$ (parts by weight) | 0.5 | $Fe_2O_3/Ni_2O_3$ | — | 0.5/0.5 |
| $MnCO_3$ | 0.5 | $CuO/V_2O_5$ | — | — |
| $MnO_2/CoO$ | — | Co | 0.5 | — |
| $WO_3/MoO_3$ | — | W | 0.5 | — |
| CaO | — | ← | — | — |
| $SnO_2$ | — | ← | — | 13 |
| Glass melting temperature (°C.) | 1550 | ← | 1550 | 1550 |
| DTA | | | | |
| Glass transition point (°C.) | 656 | ← | 666 | 666 |
| Glass softening point (°C.) | 778 | ← | 778 | 778 |
| Peak of crystallization temp. (°C.) | 890 | ← | 890 | 890 |
| TMA | | | | |
| Thermal expansion coefficient: (30–400° C.) ($\times 10^{-7}$/°C.) | 54 | ← | 54 | 54 |
| Crystalline Phase | | | | |
| Main: Mullite | ○ | ← | ○ | ○ |
| Sub.: Spinel | ○ | ← | ○ | ○ |
| Sub.: Forsterite | ○ | ← | ○ | ○ |
| Sub.: Sapphirine | — | ← | — | — |
| Flexural strength (kgf/mm$^2$) | 23 | ← | 23 | 23 |
| Insulation resistance (Ω.cm) | >$10^{14}$ | ← | >$10^{14}$ | >$10^{14}$ |
| Dielectric constant | 6.6 | ← | 6.6 | 5.6 |
| Loss factor: tanδ ($\times 10^{-4}$) | 20 | ← | 20 | 20 |
| Firing atmosphere | Air | ← | $N_2$—$H_2$ | $N_2$—$H_2$ |
| Color of substrate | Black | ← | Black | Black |

TABLE 7

| | (COMPARATIVE EXAMPLES A) | | | | |
|---|---|---|---|---|---|
| | (1) | (2) | (3) | (4) | (5) |
| GLASS COMPOSITION | | | | | |
| $Al_2O_3$ (wt %) | 43.8 | 60.0 | 48.0 | 44.0 | 51.0 |
| $SiO_2$ | 24.0 | 24.0 | 18.0 | 37.0 | 23.0 |
| $B_2O_3$ | 15.0 | 7.0 | 15.0 | 8.0 | 4.0 |
| MgO | 11.5 | 7.0 | 14.0 | 8.5 | 13.0 |
| $R_2O$ | | | | | |
| $Li_2O$ | 9.5 | 0.7 | 1.0 | — | 1.0 |
| $Na_2O$ | 0.5 | 0.7 | — | 1.0 | 1.0 |
| $K_2O$ | 0.5 | 0.6 | 1.0 | — | 1.0 |
| $Fe_2O_3/NiO$ | — | — | 1.0/— | 1.0/— | 2.0/3.0 |
| $CuO/V_2O_5$ | — | — | —/1.0 | — | 1.0/— |
| $MnO_2/CoO$ | — | — | — | — | — |
| $WO_3/MoO_3$ | —/0.5 | — | —/1.0 | —/0.5 | — |
| Glass melting temperature (°C.) | 1515 | ≧1600 | 1545 | 1560 | 1800 |
| DTA | | | | | |
| Glass transition point (°C.) | 700 | not melted | 674 | 715 | 706 |
| Glass softening point (°C.) | 829 | | 784 | 859 | 836 |

TABLE 7-continued

(COMPARATIVE EXAMPLES A)

|  | (1) | (2) | (3) | (4) | (5) |
|---|---|---|---|---|---|
| Peak of crystallization temp. (°C.) TMA | 912 |  | 877 | 938 | 938 |
| Thermal expansion coefficient: (30–400° C.) (× $10^{-7}$/°C.) | 60 |  | 65 | 55 | 62 |
| Crystalline Phase |  |  |  |  |  |
| Main: Mallite | O |  | O | O | O |
| Sub.: Spinel | — |  | — | — | O |
| Sub.: Forsterite | O |  | — | — | — |
| Sub.: Sapphirine | — |  | — | — | O |
| Sub.: Cordierite | — |  | — | O | — |
| Flexural strength (kgf/mm$^2$) | 18 |  | 16 | 19 | 21 |
| Insulation resistance (Ω.cm) | >$10^{14}$ |  | >$10^{14}$ | >$10^{14}$ | >$10^{14}$ |
| Dielectric constant | 6.3 |  | 6.7 | 6.6 | 6.8 |
| Loss factor: tanδ (× $10^{-4}$) | 15 |  | 18 | 43 | 19 |
| Firing atmosphere | Air |  | $N_2$ | $N_2$ | Air |
| Color of substrate | P. Gray |  | Black | Black | Black |

*P. Gray: Pale Gray

TABLE 8

(COMPARATIVE EXAMPLES A)

|  | (6) | (7) | (8) | (9) |
|---|---|---|---|---|
| GLASS COMPOSITION |  |  |  |  |
| $Al_2O_3$ (wt %) | 48.0 | 47.0 | 46.0 | 50.0 |
| $SiO_2$ | 22.0 | 30.0 | 23.5 | 20.0 |
| $B_2O_3$ | 16.5 | 13.0 | 5.0 | 12.0 |
| MgO | 7.5 | 4.0 | 22.5 | 10.0 |
| $R_2O$ |  |  |  |  |
| $Li_2O$ | 1.5 | — | 0.7 | 0.7 |
| $Na_2O$ | 2.0 | 3.0 | 0.7 | 0.7 |
| $K_2O$ | 1.5 | 1.0 | 0.6 | 0.6 |
| $Fe_2O_3$/NiO | — | 0.5/— | —/1.0 | — |
| CuO/$V_2O_5$ | — | 0.5/— | — | — |
| $MnO_2$/CoO | 0.3/0.3 | 0.5/0.5 | — | 6.0/— |
| $WO_3$/$MoO_3$ | 0.2/0.2 | — | — | — |
| Glass melting temperature (°C.) | 1535 | 1590 | ≧1600 | 1576 |
| DTA |  |  |  |  |
| Glass transition point (°C.) | 671 | 698 | not melted | 687 |
| Glass softening point (°C.) | 788 | 834 |  | 809 |

TABLE 8-continued

(COMPARATIVE EXAMPLES A)

|  | (6) | (7) | (8) | (9) |
|---|---|---|---|---|
| Peek of crystallization temp. (°C.) TMA | 872 | 926 |  | 892 |
| Thermal expansion coefficient: (30–400° C.) (×$10^{-7}$/°C.) | 66 | 58 |  | 63 |
| Crystalline Phase Main: Mullite | O | O |  | O |
| Sub.: Spinel | — | — | O | — |
| Sub.: Forsterite | O | — |  | O |
| Sub.: Sapphirine | — | — |  | — |
| Sub.: Cordierite | — | — |  | — |
| Flexural strength (kgf/mm$^2$) | 18 | 19 |  | 21 |
| Insulation resistance (Ω · cm) | <$10^{14}$ | <$10^{14}$ |  | <$10^{14}$ |
| Dielectric constant | 7.4 | 6.7 |  | 7.0 |
| Lose factor: tan δ (×$10^{-4}$) | 29 | 26 |  | 15 |
| Firing atmosphere | $N_2$—$H_2$ | Air |  | $N_2$—$H_2$ |
| Color of substrate | Black | Black |  | Black |

TABLE 9

(EXAMPLES B)

|  | (24) | (25) | (26) | (27) | (28) |
|---|---|---|---|---|---|
| GLASS COMPOSITION |  |  |  |  |  |
| $Al_2O_3$ (wt %) | 50.0 | 45.5 | 48.5 | 50.0 | 53.0 |
| $SiO_2$ | 25.0 | 25.5 | 27.0 | 28.0 | 26.0 |
| $B_2O_9$ | 10.5 | 15.0 | 11.0 | 9.0 | 8.0 |
| MgO | 11.5 | 14.0 | 11.0 | 10.0 | 10.0 |
| $R_2O$ |  |  |  |  |  |
| $Li_2O$ | 0.7 | — | 0.6 | 1.0 | 0.7 |
| $Na_2O$ | 0.7 | — | 0.6 | 1.0 | 0.7 |
| $K_2O$ | 0.6 | — | 0.6 | 1.0 | 0.6 |

TABLE 9-continued

| | (EXAMPLES B) | | | | |
|---|---|---|---|---|---|
| | (24) | (25) | (26) | (27) | (28) |
| Coloring Component | Fe$_2$O$_3$/0.5 MnO$_2$/0.5 | — | MoO$_3$/0.7 | — | MoO$_3$/0.7 WO$_3$/0.3 |
| Total | 100 | 100 | 100 | 100 | 100 |
| Glass Powder (wt %) | 98.0 | 94.0 | 90.0 | 88.5 | 90.0 |
| Inorganic Filler (wt %) | Al$_2$O$_3$/2.0 | Al$_2$O$_3$/5.0 Fe$_2$O$_3$/0.5 V$_2$O$_5$/0.5 | Al$_2$O$_3$/10.0 | Mullite/10.0 CuO/0.5 NiO/1.0 | Cordie./10.0 |
| Mean Specific Surface Area (m$^2$/g) | 5.0 | 5.3 | 5.0 | 3.8 | 2.0 |
| Glass melting temperature (°C.) | 1555 | 1550 | 1560 | 1540 | 1580 |
| DTA | | | | | |
| Glass transition point (°C.) | 699 | 699 | 691 | 687 | 699 |
| Glass softening point (°C.) | 816 | 823 | 815 | 816 | 824 |
| Peek of crystallization temp. (°C.) | 917 | 918 | 918 | 912 | 925 |
| TMA | | | | | |
| Thermal expansion coefficient: (30–400° C.) ($\times 10^{-7}$/°C.) | 43 | 42 | 47 | 44 | 34 |
| Crystalline Phase Main | Mullite | Mullite | Mullite | Mullite | Cordie. |
| Main | Cordie. | Cordie. | Cordie. | Cordie. | Mullite |
| Sub. | Spinel | Spinel | Spinel | Spinel | Spinel |
| Flexural strength (kgf/mm$^2$) | 25 | 24 | 25 | 26 | 26 |
| Insulation resistance (Ω · cm) | >10$^{14}$ | >10$^{14}$ | >10$^{14}$ | >10$^{14}$ | >10$^{14}$ |
| Dielectric constant | 6.6 | 6.5 | 6.4 | 6.7 | 6.4 |
| Loss factor: tan δ ($\times 10^{-4}$) | 16 | 12 | 17 | 21 | 16 |
| Sintering temperature (°C.) | 900 | 950 | 1000 | 1000 | 1050 |
| Firing atmosphere | Air | N$_2$ | N$_2$—H$_2$ | Air | N$_2$—H$_2$ |
| Color of substrate | Black | Black | Black | Black | Black |

*Cordie.: Cordierite, Forste.: Forsterite

TABLE 10

| | (EXAMPLES B) | | | | |
|---|---|---|---|---|---|
| | (29) | (30) | (31) | (32) | (33) |
| GLASS COMPOSITION | | | | | |
| Al$_2$O$_3$ (wt %) | 57.0 | 47.0 | 50.0 | 48.0 | 48.0 |
| SiO$_2$ | 26.0 | 32.0 | 24.0 | 24.0 | 21.0 |
| B$_2$O$_3$ | 7.0 | 8.0 | 12.0 | 7.0 | 12.0 |
| MgO | 7.0 | 8.0 | 9.0 | 18.0 | 15.0 |
| R$_2$O | | | | | |
| Li$_2$O | 1.0 | 1.0 | 0.7 | — | 0.7 |
| Na$_2$O | 1.0 | 2.0 | 0.7 | 1.0 | 0.7 |
| K$_2$O | 1.0 | 1.0 | 0.6 | 1.0 | 0.6 |
| Coloring Component | — | MoO$_3$/1.0 | MoO$_3$/3.0 | MnO$_2$/1.0 | V$_2$O$_5$/1.0 NiO/1.0 |
| Total | 100 | 100 | 100 | 100 | 100 |
| Glass Powder (wt %) | 99.7 | 80.0 | 87.0 | 95.0 | 95.0 |
| Inorganic Filler (wt %) | Spinel/0.3 | Zirconia/20.0 | Al$_2$O$_3$/5.0 Mullite/5.0 Cordie./3.0 | Yttria/5.0 | Cr$_2$O$_3$/5.0 |
| Mean Specific Surface Area (m$^2$/g) | 1.8 | 2.2 | 3.7 | 3.5 | 3.1 |
| Glass melting temperature (°C.) | 1580 | 1545 | 1550 | 1565 | 1550 |
| DTA | | | | | |
| Glass transition point (°C.) | 701 | 683 | 695 | 695 | 682 |
| Glass softening point (°C.) | 828 | 808 | 815 | 819 | 804 |
| Peak of crystallization temp. (°C.) | 930 | 902 | 910 | 915 | 906 |
| TMA | | | | | |
| Thermal expansion coefficient: | 53 | 52 | 41 | 49 | 50 |

TABLE 10-continued

| | (EXAMPLES B) | | | | |
|---|---|---|---|---|---|
| | (29) | (30) | (31) | (32) | (33) |
| (30–400° C.) ($\times 10^{-7}$/°C.) | | | | | |
| Crystalline Phase Main | Mullite | Mullite | Mullite | Mullite | Mullite |
| Main | Forste. | Cordie. | Cordie. | Cordie. | Cordie. |
| Sub. | Cordie. | Zirconia | Spinel | Spinel | Spinel |
| Flexural strength (kgf/mm$^2$) | 23 | 23 | 25 | 24 | 24 |
| Insulation resistance ($\Omega \cdot$ cm) | >10$^{14}$ | >10$^{14}$ | >10$^{14}$ | >10$^{14}$ | >10$^{14}$ |
| Dielectric constant | 6.5 | 6.7 | 6.6 | 5.7 | 6.7 |
| Loss factor: tan δ ($\times 10^{-4}$) | 20 | 23 | 16 | 18 | 16 |
| Sintering temperature (°C.) | 900 | 1050 | 1000 | 1000 | 1000 |
| Firing atmosphere | Air | N$_2$ | N$_2$—H$_2$ | N$_2$—H$_2$ | Air |
| Color of substrate | White | Black | Black | Black | Black |

*Cordie.: Cordierite, Forste.: Forsterite

TABLE 11

| | (EXAMPLES B) | | | | |
|---|---|---|---|---|---|
| | (34) | (35) | (36) | (37) | (38) |
| GLASS COMPOSITION | | | | | |
| Al$_2$O$_3$ (wt %) | 50.0 | 48.0 | 49.0 | 45.5 | 49.0 |
| SiO$_2$ | 28.0 | 24.0 | 27.0 | 25.5 | 26.5 |
| B$_2$O$_9$ | 10.0 | 8.0 | 11.0 | 15.0 | 11.0 |
| MgO | 10.0 | 17.0 | 11.0 | 14.0 | 11.0 |
| R$_2$O | | | | | |
| Li$_2$O | 0.7 | — | 0.7 | — | 0.7 |
| Na$_2$O | 0.7 | 1.0 | 0.7 | — | 0.7 |
| K$_2$O | 0.6 | 1.0 | 0.6 | — | 0.6 |
| Coloring Component | — | MnO$_2$/1.0 | — | — | MoO$_9$/0.5 |
| Total | 100 | 100 | 100 | 100 | 100 |
| Glass Powder (wt %) | 93.0 | 95.0 | 92.0 | 88.8 | 95.0 |
| Inorganic Filler (wt %) | SiO$_2$/7.0 | Talc/5.0 | MgCO$_3$/5.0 MnCO$_3$/3.0 | Al$_4$B$_2$O$_9$/10.0 MoO$_3$/0.6 CoO/0.6 | Al$_2$O$_3$/4.5 Cordie./0.5 |
| Mean Specific Surface Area (m$^2$/g) | 1.4 | 1.6 | 9.5 | 2.6 | 4.7 |
| Glass melting temperature (°C.) | 1560 | 1560 | 1560 | 1550 | 1560 |
| DTA | | | | | |
| Glass transition point (°C.) | 695 | 693 | 689 | 696 | 689 |
| Glass softening point (°C.) | 822 | 818 | 810 | 820 | 811 |
| Peak of crystallization temp. (°C.) | 919 | 911 | 913 | 917 | 915 |
| TMA | | | | | |
| Thermal expansion coefficient: (30–400° C.) ($\times 10^{-7}$/°C.) | 42 | 48 | 48 | 43 | 47 |
| Crystalline Phase Main | Mullite | Mullite | Mullite | Mullite | Mullite |
| Main | Cordie. | Cordie. | Cordie, | Cordie. | Cordie. |
| Sub. | Spinel | Spinel | Spinel | Spinel | Spinel |
| Flexural strength (kgf/mm$^2$) | 25 | 24 | 25 | 24 | 25 |
| Insulation resistance ($\Omega \cdot$ cm) | >10$^{14}$ | >10$^{14}$ | >10$^{14}$ | >10$^{14}$ | >10$^{14}$ |
| Dielectric constant | 6.4 | 6.8 | 6.4 | 6.4 | 6.4 |
| Loss factor: tan δ ($\times 10^{-4}$) | 18 | 18 | 18 | 13 | 18 |
| Sintering temperature (°C.) | 1000 | 1000 | 1000 | 950 | 950 |
| Firing atmosphere | Air | N$_2$—H$_2$ | N$_2$—H$_2$ | N$_2$—H$_2$ | N$_2$ |
| Color of substrate | White | Black | Black | Black | Black |

*Cordie.: Cordierite, Forste.: Forsterite

TABLE 12

| | (COMPARATIVE EXAMPLES B1) | | | | |
|---|---|---|---|---|---|
| | (10) | (11) | (12) | (13) | (14) |
| GLASS COMPOSITION | | | | | |
| Al$_2$O$_3$ (wt %) | 50.0 | 45.0 | 48.0 | 44.0 | 48.5 |

TABLE 12-continued

| | (COMPARATIVE EXAMPLES B1) | | | | |
|---|---|---|---|---|---|
| | (10) | (11) | (12) | (13) | (14) |
| $SiO_2$ | 25.0 | 25.0 | 24.0 | 37.5 | 22.0 |
| $B_2O_3$ | 10.5 | 15.0 | 7.0 | 8.5 | 16.5 |
| MgO | 11.5 | 13.5 | 18.0 | 8.5 | 8.5 |
| $R_2O$ | | | | | |
| $Li_2O$ | 0.7 | 0.5 | — | — | 1.5 |
| $Na_2O$ | 0.7 | 0.5 | 1.0 | 0.8 | 2.0 |
| $K_2O$ | 0.6 | 0.5 | 1.0 | 0.8 | 1.5 |
| Coloring Component | $Fe_2O_3$/0.5 $MnO_2$/0.5 | — | $MnO_2$/1.0 | $MoO_3$/0.6 $WO_9$/0.3 | — |
| Total | 100 | 100 | 100 | 100 | 100 |
| Glass Powder (wt %) | 78.0 | 74.0 | 99.95 | 90.0 | 95.0 |
| Inorganic Filler (wt %) | $Al_2O_3$/22.0 | $Al_2O_3$/10.0 Mullite/15.0 $MoO_3$/1.0 | $Al_2O_3$/0.05 | Mullite/10.0 | Cordie./5.0 |
| Mean Specific Surface Area ($m^2$/g) | 5.0 | 3.9 | 5.0 | 3.5 | 2.0 |
| Glass melting temperature (°C.) | 1555 | 1535 | 1565 | 1560 | 1530 |
| DTA | | | | | |
| Glass transition point (°C.) | 708 | 703 | 690 | 710 | 575 |
| Glass softening point (°C.) | 825 | 822 | 813 | 841 | 785 |
| Peak of crystallization temp. (°C.) | 924 | 930 | 903 | 925 | 850 |
| TMA | | | | | |
| Thermal expansion coefficient: (30–400° C.) ($\times 10^{-7}$/°C.) | 52 | 55 | 62 | 45 | 58 |
| Crystalline Phase Main | Mullite | Mullite | Mullite | Cordie. | Mullite |
| Main | Cordie. | Cordie. | Spinel | Mullite | Forste. |
| Sub. | Spinel | Spinel | — | — | Cordie. |
| Flexural strength (kgf/$mm^2$) | 19 | 18 | 22 | 18 | 19 |
| Insulation resistance ($\Omega \cdot$ cm) | $>10^{14}$ | $>10^{14}$ | $>10^{14}$ | $>10^{14}$ | $>10^{14}$ |
| Dielectric constant | 5.8 | 6.5 | 6.7 | 6.4 | 7.2 |
| Loss factor: tan δ ($\times 10^{-4}$) | 16 | 15 | 19 | 20 | 25 |
| Sintering temperature (°C.) | 1050 | 1050 | 950 | 1900 | 950 |
| Firing atmosphere | Air | $N_2$—$H_2$ | Air | $N_2$—$H_2$ | Air |
| Color of substrate | Black | Black | Black | Black | White |

*Cordie.: Cordierite, Forste.: Forsterite

TABLE 13

| | (COMPARATIVE EXAMPLES B1) | | | | |
|---|---|---|---|---|---|
| | (15) | (16) | (17) | (18) | (19) |
| GLASS COMPOSITION | | | | | |
| $Al_2O_3$ (wt %) | 51.0 | 59.5 | 50.0 | 49.0 | 56.0 |
| $SiO_2$ | 23.0 | 24.0 | 18.0 | 30.0 | 25.0 |
| $B_2O_3$ | 4.0 | 7.0 | 7.0 | 13.0 | 11.0 |
| MgO | 14.0 | 7.0 | 22.0 | 4.0 | 12.0 |
| $R_2O$ | | | | | |
| $Li_2O$ | 1.0 | 0.6 | 0.7 | — | 0.7 |
| $Na_2O$ | 1.0 | 0.6 | 0.7 | 4.0 | 0.7 |
| $K_2O$ | 1.0 | 0.6 | 0.6 | — | 0.5 |
| Coloring Component | $Fe_2O_9$/2.0 $V_2O_5$/1.0 NiO/2.0 | $MoO_3$/0.7 | $MnO_2$/1.0 | — | — |
| Total | 100 | 100 | 100 | 100 | 100 |
| Glass Powder (wt %) | 75.0 | — | — | 98.0 | 72.0 |
| Inorganic Filler (wt %) | Celsian/25.0 | — | — | $MnO_2$/1.0 $WO_9$/1.0 | $SnO_2$/13.0 $CaCO_9$/15.0 |
| Mean Specific Surface Area ($m^2$/g) | 5.8 | | | 1.5 | 1.4 |
| Glass melting temperature (°C.) | 1500 | ≧1600 | ≧1600 | 1600 | 1555 |

TABLE 13-continued

| | (COMPARATIVE EXAMPLES B1) | | | | |
|---|---|---|---|---|---|
| | (15) | (16) | (17) | (18) | (19) |
| DTA | | | | | |
| Glass transition point (°C.) | 719 | not melted | not melted | 704 | 705 |
| Glass softening point (°C.) | 845 | | | 840 | 821 |
| Peak of crystallization temp. (°C.) | 945 | | | 933 | 921 |
| TMA | | | | | |
| Thermal expansion coefficient: (30–400° C.) ($\times 10^{-7}$/°C.) | 51 | | | 61 | 56 |
| Crystalline Phase Main | Mullite | | | Mullite | Mullite |
| Main | Spinel | | | Spinel | Cordie. |
| Sub. | Celsian | | | — | Spinel |
| Flexural strength (kgf/mm$^2$) | 17 | | | 19 | 18 |
| Insulation resistance ($\Omega \cdot$ cm) | >10$^{14}$ | | | >10$^{14}$ | >10$^{14}$ |
| Dielectric constant | 7.1 | | | 6.8 | 7.0 |
| Loss factor: tan δ ($\times 10^{-4}$) | 17 | | | 36 | 18 |
| Sintering temperature (°C.) | 1050 | | | 1050 | 1050 |
| Firing atmosphere | Air | | | N$_2$—H$_2$ | Air |
| Color of substrate | Black | | | Black | White |

*Cordie.: Cordierite, Forste.: Forsterite

TABLE 14

| | (COMPARATIVE EXAMPLES B2) | | | |
|---|---|---|---|---|
| | (20) | (21) | (22) | (23) |
| GLASS COMPOSITION | | | | |
| Al$_2$O$_3$ (wt %) | 49.5 | 53.0 | 50.0 | 45.0 |
| SiO$_2$ | 28.0 | 25.0 | 28.0 | 22.0 |
| B$_2$O$_3$ | 10.0 | 8.0 | 9.0 | 16.5 |
| MgO | 10.0 | 10.0 | 10.0 | 8.5 |
| R$_2$O | | | | |
| Li$_2$O | 0.7 | 0.7 | 1.0 | 1.5 |
| Na$_2$O | 0.7 | 0.7 | 1.0 | 2.0 |
| K$_2$O | 0.6 | 0.6 | 1.0 | 1.5 |
| Coloring Component | MoO$_3$/0.5 | MoO$_3$/0.7 WO$_3$/0.3 | — | — |
| Total | 100 | 100 | 100 | 100 |
| Glass Powder (wt %) | 95.0 | 90.0 | 94.0 | 95.0 |
| Inorganic Filler (wt %) | Al$_2$O$_3$/5.0 | Al$_2$O$_3$/7.0 Zirconia/3.0 | Mullite/5.0 NiO/0.5 Fe$_2$O$_3$/0.5 | Al$_2$O$_3$/5.0 |
| Mean Specific Surface Area (m$^2$/g) | 1.2 | 0.8 | 1.0 | 1.2 |
| Glass melting temperature (°C.) | 1550 | 1530 | 1540 | 1530 |
| DTA | | | | |
| Glass transition point (°C.) | 694 | 702 | 682 | 678 |
| Glass softening point (°C.) | 822 | 821 | 811 | 791 |
| Peak of crystallization temp. (°C.) | 917 | 925 | 912 | 900 |
| TMA | | | | |
| Thermal expansion coefficient: (30–400° C.) ($\times 10^{-7}$/°C.) | 59 | 61 | 62 | 66 |
| Crystalline Phase Main | Mullite | Mullite | Mullite | Mullite |
| Main | Spinel | Spinel | Spinel | Spinel |
| Sub. | — | Forste. | — | — |
| Flexural strength (kgf/mm$^2$) | 25 | 26 | 25 | 19 |
| Insulation resistance ($\Omega \cdot$ cm) | >10$^{14}$ | >10$^{14}$ | >10$^{14}$ | >10$^{14}$ |
| Dielectric constant | 6.4 | 5.7 | 6.7 | 7.4 |
| Loss factor: tan δ ($\times 10^{-4}$) | 18 | 16 | 22 | 25 |
| Sintering temperature (°C.) | 950 | 1050 | 1000 | 950 |

TABLE 14-continued (COMPARATIVE EXAMPLES B2)

|  | (20) | (21) | (22) | (23) |
|---|---|---|---|---|
| Firing atmosphere | $N_2$ | $N_2$—$H_2$ | Air | Air |
| Color of substrate | Black | Black | Black | White |

*Cordie.: Cordierite, Forste.: Forsterite

What is claimed is:

1. A crystallizable glass composition for producing a glass-ceramic substrate capable of being sintered at a low temperature comprising by weight percent, oxides of:
   from 45 to 58% $Al_2O_3$;
   from 20 to 35% $SiO_2$;
   from 5 to 15% $B_2O_3$;
   from 5 to 20% MgO;
   from 1 to 4% of $R_2O$, wherein said $R_2O$ is a combination of at least two members selected from the group consisting of $Li_2O$, $Na_2O$ and $K_2O$, and
   wherein, in the course of execution of a heat treatment, said crystallizable glass composition precipitates a main crystalline phase consisting of mullite, and a subordinate crystalline phase consisting of at least one member selected from the group consisting of forsterite, spinel and sapphirine.

2. The crystallizable glass composition according to claim 1, wherein said crystallizable glass composition further comprises from 0.1% to 5% by weight of at least one member selected from the group consisting of copper oxide, vanadium oxide, molybdenum oxide, tungsten oxide, iron oxide, nickel oxide, manganese oxide, and cobalt oxide.

3. The crystallizable glass composition according to claim 1, wherein said crystallizable glass composition is characterized by adding and mixing 0.1 through 5 parts by weight of at least one member of coloring fillers selected from the group consisting of metal oxide powder, metal salt powder, and metal powder, wherein the metal component of said metal oxide powder, metal salt powder, metal powder being at least one member selected from the group consisting of copper, vanadium, molybdenum, tungsten, iron, nickel, manganese, cobalt, to and with 100 parts by weight of said glass composition.

4. The crystallizable glass composition for a glass-ceramic substrate according to claim 1, wherein said substrate has a minimum of about 23 kgf/mm² of flexural strength.

5. The crystallizable glass composition according to claim 1, wherein each of said $K_2O$, $Na_2O$ and $Li_2O$ is present in amounts ranging from 0 and 2 weight %.

6. A crystallizable glass composition for producing a glass-ceramic substrate capable of being sintered at a low temperature, by weight percentage, comprising:
   from 47 to 53% $Al_2O_3$;
   from 24 to 33% $SiO_2$;
   from 5 to 15% $B_2O_3$;
   from 7 to 14% MgO;
   from 0 to 4% of $R_2O$, wherein said $R_2O$ is a combination of at least two members selected from the group consisting of $Li_2O$, $Na_2O$ and $K_2O$.

7. The crystallizable glass composition according to claim 6, wherein said crystallizable glass composition comprising the following components expressed in terms of percent by weight on the oxide basis:

| $Al_2O_3$: | 47%–51% | $SiO_2$: | 25%–30% |
|---|---|---|---|
| $B_2O_3$: | 7%–13% | MgO: | 8%–12.5% |
| $Li_2O$: | 0%–2% | $Na_2O$: | 0%–2% |
| $K_2O$: | 0%–2% | | |

0%–4% of $R_2O$; wherein $R_2O$ is a combination of at least two oxides selected from the group consisting of $Li_2O$, $Na_2O$ and $K_2O$.

8. The crystallizable glass composition according to claim 6, wherein said crystallizable glass composition, during heat treatment, precipitates, a main crystalline phase consisting of mullite, and a subordinate crystalline phase comprising of at least one member selected from the group consisting of forsterite, spinel and sapphirine.

9. A composition for a glass-ceramic substrate complete with a firing process under low temperature comprising 80% through 99.9% by weight of a crystallizable glass powder and 0.1% through 20% by weight of an inorganic filler having a minimum of 1.4 m²/g of mean specific surface area,
   wherein oxide components of said crystallizable glass powder are shown below in terms of percent by weight.

| $Al_2O_3$: | 45%–58% | $SiO_2$: | 20%–35% |
|---|---|---|---|
| $B_2O_3$: | 5%–15% | MgO: | 5%–20% |
| $Li_2O$: | 0%–2% | $Na_2O$: | 0%–2% |
| $K_2O$: | 0%–2% | | |

0%–4% of $R_2O$; wherein $R_2O$ is a combination of at least two oxides selected from the group consisting of $Li_2O$, $Na_2O$ and $K_2O$.

10. The composition according to claim 9,
   wherein the crystallizable glass powder mainly precipitates mullite crystalline phase as a result of a heat treatment; and
   wherein the inorganic filler is combined as external additive with the glass powder in order that cordierite can be precipitated in the direction of the interior of glass from the interface which is in contact with the crystallizable glass powder in the course of execution of a heat treatment.

11. The composition for a glass-ceramic substrate according to claim 9;
   wherein the inorganic filler is at least one member selected from the group consisting of silica glass, aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides; and also consisting of compounds transformable into oxides after a heat treatment; and said oxide is at least one member selected from the group consisting of aluminum oxides, silicon oxides, magnesium oxides, calcium oxides, strontium oxides, barium oxides, zinc oxides, zirconium oxides, titanium oxides, germanium oxides, tin oxides, gallium oxides, chromium oxides, niobium oxides, tantalum oxides, cobalt oxides, copper oxides, iron oxides, manganese oxides, molybdenum oxides, nickel oxides, vanadium oxides, tungsten oxides, and rare-earth metal oxides.

12. The composition for a glass-ceramic substrate according to claim 9, wherein the inorganic filler includes clay minerals; and said clay mineral is at least one member selected from the group consisting of dolomite, talc, and kaolinite.

13. The composition for a glass-ceramic substrate according to claim 9, wherein the inorganic filler is at least one member selected from the group consisting of the double oxides and the solid solutions at least comprising two members of oxide component selected from the group consisting of $Al_2O_3$, $SiO_2$, $B_2O_3$, $P_2O_5$, MgO, CaO, BrO, BaO, ZnO, $ZrO_2$, $TiO_2$, $Li_2O$, $Na_2O$, $K_2O$, $Cr_2O_3$, CoO, CuO, $Fa_2O_3$, and $MnO_2$.

14. The composition for a glass-ceramic substrate according to claim 9, wherein the inorganic filler is at least one member selected from the group consisting of the double oxides and the solid solutions selected from the group consisting of mullite, sillimanite, cordierite, wollastonite, forstarite, steatite, spinel, zircon, anorthite, celsian, eucryptite, spodumene, titanite, willemite, gahnite, enstatite, gahlenite, aluminum titanate, and aluminum borate.

15. The composition for a glass-ceramic substrate according to claim 9, wherein:

said crystallizable glass powder comprises the following components expressed in terms of percent by weight on the oxide basis:

| | |
|---|---|
| $Al_2O_3$: | 47%–53%; |
| $B_2O_3$: | 5%–15%; |
| $Li_2O$: | 0%–2%; |
| $K_2O$: | 0%–2%; |
| $SiO_2$: | 20%–35%; |
| MgO: | 5%–20%; |
| $Na_2O$: | 0%–2%; and |

0–4% of $R_2O$, wherein said $R_2O$ is a combination of at least two oxides selected from the group consisting of $Li_2O$, $Na_2O$ and $K_2O$.

16. The composition for a glass-ceramic substrate according to claim 9, wherein:

said crystallizable glass powder comprises the following components expressed in terms of percent by weight on the oxide basis:

| | |
|---|---|
| $Al_2O_3$: | 45%–58%; |
| $B_2O_3$: | 5%–15%; |
| $Li_2O$: | 0%–2%; |
| $K_2O$: | 0%–2%; |
| $SiO_2$: | 20%–35%; |
| MgO: | 5%–20%; |
| $Na_2O$: | 0%–2%; and |

0.5%–3% of $R_2O$, wherein said $R_2O$ is a combination of at least two oxides selected from the group consisting of $Li_2O$, $Na_2O$ and $K_2O$.

17. The composition for a glass-ceramic substrate according to claim 9, wherein:

said crystallizable glass powder comprises the following components expressed in terms of percent by weight on the oxide basis:

| | |
|---|---|
| $Al_2O_3$: | 47%–53%; |
| $B_2O_3$: | 5%–15%; |
| $Li_2O$: | 0%–2%; |
| $K_2O$: | 0%–2%; |
| $SiO_2$: | 24%–33%; |
| MgO: | 7%–14%; |
| $Na_2O$: | 0%–2%; and |

0.5%–3% of $R_2O$, wherein said $R_2O$ is a combination of at least two oxides selected from the group consisting of $Li_2O$, $Na_2O$ and $K_2O$.

18. The composition for a glass-ceramic substrate according to claim 9, wherein:

said composition comprises 85%–99%, by weight of said crystallizable glass powder and 1%–15%, by weight percent of the inorganic filler, wherein said inorganic filler has a minimum of 1.4 $m^2/g$ of mean specific surface area;

wherein oxide components of said crystallizable glass powder comprise the following components expressed in terms of percent by weight:

| | |
|---|---|
| $Al_2O_3$: | 47%–51%; |
| $B_2O_3$: | 7%–13%; |
| $Li_2O$: | 0%–2%; |
| $K_2O$: | 0%–2%; |
| $SiO_2$: | 25%–30%; |
| MgO: | 8%–12.5%; |
| $Na_2O$: | 0%–2%; and |

1–3% of $R_2O$, wherein said $R_2O$ is a combination of at least two oxides selected from the group consisting of $Li_2O$, $Na_2O$ and $K_2O$.

19. The composition for a glass-ceramic substrate according to claim 9 wherein:

said composition comprises 85%–99%, by weight of said crystallizable glass powder and 1%–15%, by weight percent of the inorganic filler, wherein said filler has a minimum of 1.4 $m^2/g$ of mean specific surface area;

wherein oxide components of said crystallizable glass powder comprise the following components expressed in terms of percent by weight:

| | |
|---|---|
| $Al_2O_3$: | 47%–51%; |
| $B_2O_3$: | 7%–13%; |
| $Li_2O$: | 0%–2%; |
| $K_2O$: | 0%–2%; |
| $SiO_2$: | 25%–30%; |
| MgO: | 8%–12.5%; |
| $Na_2O$: | 0%–2%; |

1–3% of $R_2O$, wherein said $R_2O$ is a combination of at least two oxides selected from the group consisting of $Li_2O$, $Na_2O$ and $K_2O$; and said inorganic filler is at least one selected from the group consisting of aluminum oxide, silicon oxide, titanium oxide, chromium oxide, talc, kaolinite, mullite, sillimanite, cordierite, wollastonite, forsterite, steatite, spinel, zircon, anorthite, celsian and aluminum borate.

20. The composition for a glass-ceramic substrate according to claim 9 wherein:

said composition comprises 88%–97%, by weight of said crystallizable glass powder and 3%–12%, by weight percent of the inorganic filler, wherein said filler has a minimum of 1.4 m²/g of mean specific surface area;

wherein oxide components of said crystallizable glass powder comprise the following components expressed in terms of percent by weight:

| | |
|---|---|
| $Al_2O_3$: | 47%–51%; |
| $B_2O_3$: | 7%–13%; |
| $Li_2O$: | 0%–2%; |

-continued

| | |
|---|---|
| $K_2O$: | 0%–2%; |
| $SiO_2$: | 25%–30%; |
| MgO: | 8%–12.5%; |
| $Na_2O$: | 0%–2%; |

1–3% of $R_2O$, wherein said $R_2O$ is a combination of at least two oxides selected from the group consisting of $Li_2O$, $Na_2O$ and $K_2O$; and said inorganic filler is at least one selected from the group consisting of aluminum oxide, mullite and cordierite.

\* \* \* \* \*